US009391145B2

(12) United States Patent
Hikosaka et al.

(10) Patent No.: US 9,391,145 B2
(45) Date of Patent: Jul. 12, 2016

(54) NITRIDE SEMICONDUCTOR ELEMENT AND NITRIDE SEMICONDUCTOR WAFER

(71) Applicant: Kabushiki Kaisha Toshiba, Minato-ku (JP)

(72) Inventors: Toshiki Hikosaka, Kawasaki (JP); Hisashi Yoshida, Koto (JP); Hajime Nago, Yokohama (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/593,296

(22) Filed: Jan. 9, 2015

(65) Prior Publication Data
US 2015/0200255 A1    Jul. 16, 2015

(30) Foreign Application Priority Data

Jan. 15, 2014    (JP) .................. 2014-005040

(51) Int. Cl.
*H01L 29/201* (2006.01)
*H01L 33/00* (2010.01)
(Continued)

(52) U.S. Cl.
CPC .......... *H01L 29/201* (2013.01); *H01L 21/0254* (2013.01); *H01L 21/0262* (2013.01);
(Continued)

(58) Field of Classification Search
CPC ............. H01L 29/2003; H01L 29/201; H01L 21/02381; H01L 21/02433; H01L 21/02458; H01L 21/02505; H01L 21/0254; H01L 21/0262; H01L 29/205; H01L 33/0025; H01L 33/32; H01L 21/02584; H01L 33/025
See application file for complete search history.

(56) References Cited

U.S. PATENT DOCUMENTS 7,193,246 B1 *   3/2007   Tanizawa et al. ............... 257/94
8,039,830 B2 *   10/2011  Kaneko .................. H01L 33/06
                                                                     257/13
(Continued)

FOREIGN PATENT DOCUMENTS

JP    2010-521064        6/2010
JP    2011-258843 A      12/2011
(Continued)

OTHER PUBLICATIONS

Extended European Search Report issued May 15, 2015 in Patent Application No. 14200332.6.
(Continued)

*Primary Examiner* — Latanya N Crawford
(74) *Attorney, Agent, or Firm* — Oblon, McClelland, Maier & Neustadt, L.L.P.

(57) ABSTRACT

According to one embodiment, a nitride semiconductor element includes a functional layer and a stacked body. The stacked body includes a GaN intermediate layer, a low Al composition layer, a high Al composition layer, and a first Si-containing layer. The low Al composition layer includes a nitride semiconductor having a first Al composition ratio. The low Al composition layer is provided between the GaN intermediate layer and the functional layer. The high Al composition layer includes a nitride semiconductor having a second Al composition ratio. The high Al composition layer is provided between the GaN intermediate layer and the low Al composition layer. The second Al composition ratio is higher than the first Al composition ratio. The first Si-containing layer is provided between the GaN intermediate layer and the high Al composition layer.

18 Claims, 12 Drawing Sheets

(51) Int. Cl.
  *H01L 33/32* (2010.01)
  *H01L 29/20* (2006.01)
  *H01L 29/205* (2006.01)
  *H01L 21/02* (2006.01)
  *H01L 33/02* (2010.01)

(52) U.S. Cl.
  CPC .... *H01L21/02381* (2013.01); *H01L 21/02433* (2013.01); *H01L 21/02458* (2013.01); *H01L 21/02505* (2013.01); *H01L 29/2003* (2013.01); *H01L 29/205* (2013.01); *H01L 33/0025* (2013.01); *H01L 33/32* (2013.01); *H01L 21/02584* (2013.01); *H01L 33/025* (2013.01)

(56) References Cited

U.S. PATENT DOCUMENTS

| | | | | |
|---|---|---|---|---|
| 8,525,194 | B2* | 9/2013 | Shioda | H01L 21/02381 257/90 |
| 8,680,537 | B2* | 3/2014 | Hikosaka | H01L 29/2003 257/76 |
| 8,785,943 | B2* | 7/2014 | Shioda | H01L 21/02381 257/76 |
| 8,981,382 | B2* | 3/2015 | Gao | 257/76 |
| 2008/0217645 | A1 | 9/2008 | Saxler et al. | |
| 2009/0114900 | A1* | 5/2009 | Udagawa | 257/13 |
| 2010/0059734 | A1* | 3/2010 | Kaneko et al. | 257/13 |
| 2010/0320443 | A1* | 12/2010 | Jiang et al. | 257/14 |
| 2012/0119219 | A1* | 5/2012 | Takado et al. | 257/76 |
| 2013/0062612 | A1 | 3/2013 | Shioda et al. | |
| 2013/0087762 | A1 | 4/2013 | Hung et al. | |
| 2013/0134386 | A1* | 5/2013 | Choi et al. | 257/13 |
| 2013/0234151 | A1* | 9/2013 | Hikosaka | H01L 29/2003 257/76 |
| 2013/0237036 | A1 | 9/2013 | Hikosaka et al. | |
| 2013/0248815 | A1* | 9/2013 | Fuke et al. | 257/11 |
| 2014/0084296 | A1 | 3/2014 | Yoshida et al. | |
| 2014/0084338 | A1 | 3/2014 | Harada et al. | |
| 2015/0041755 | A1* | 2/2015 | Zhang et al. | 257/13 |

FOREIGN PATENT DOCUMENTS

| | | |
|---|---|---|
| JP | 2013-84819 A | 5/2013 |
| JP | 2014-63903 A | 4/2014 |
| KR | 10-2013-0103293 | 9/2013 |

OTHER PUBLICATIONS

Office Action issued Dec. 9, 2015, in Korean Patent Application No. 10-2015-0004085 (with English translation).

\* cited by examiner

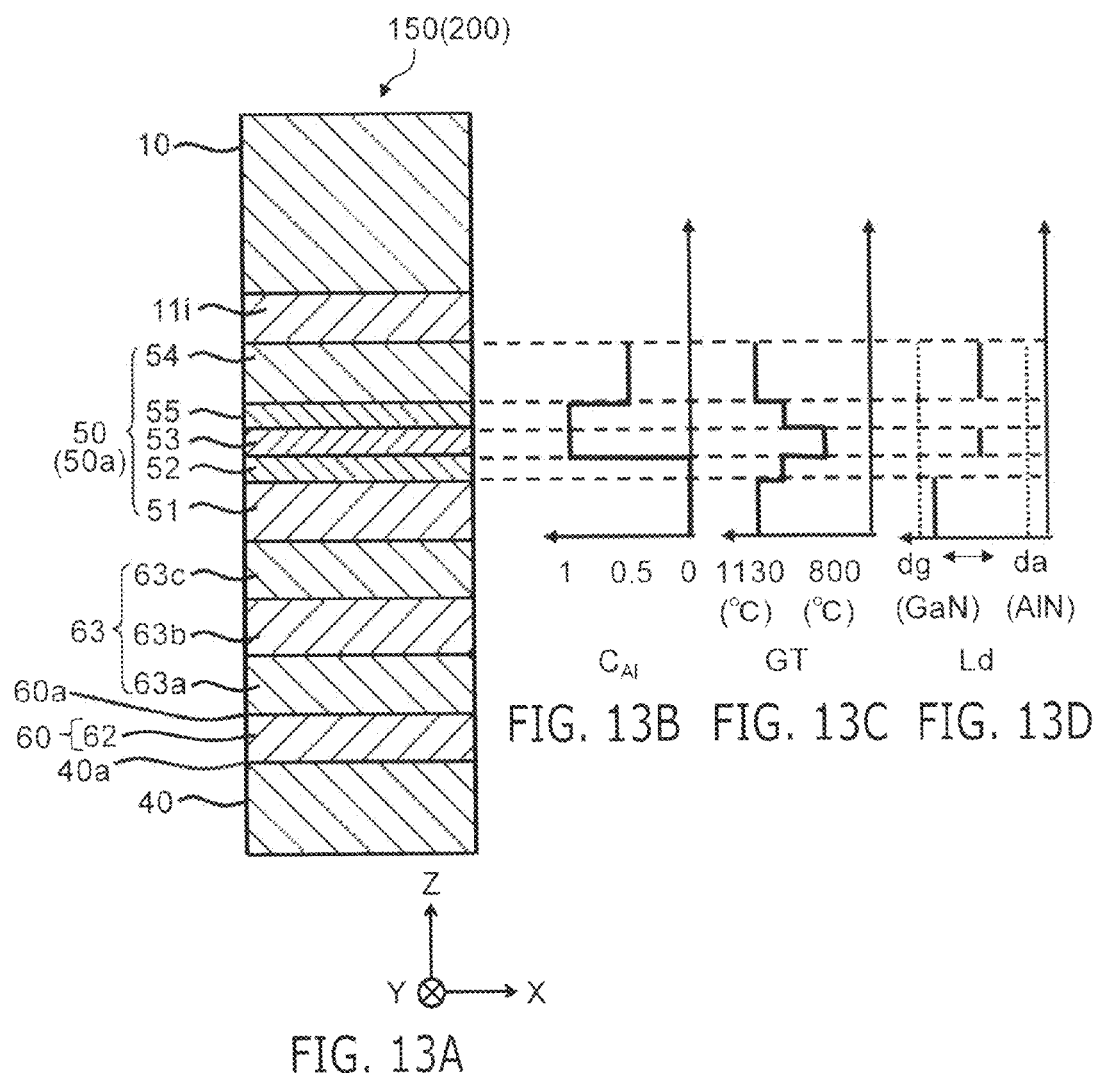

US 9,391,145 B2

NITRIDE SEMICONDUCTOR ELEMENT AND NITRIDE SEMICONDUCTOR WAFER

CROSS-REFERENCE TO RELATED APPLICATIONS

This application is based upon and claims the benefit of priority from Japanese Patent Application No. 2014-005040, filed on Jan. 15, 2014; the entire contents of which are incorporated herein by reference.

FIELD

Embodiments described herein relate generally to a nitride semiconductor element and a nitride semiconductor wafer.

BACKGROUND

Light emitting diodes (LEDs), which are semiconductor light emitting elements that use nitride semiconductors, are used in, for example, display devices, illumination, etc. Electronic devices that use nitride semiconductors may be used as high-speed electronic devices, power devices, etc.

When such a nitride semiconductor element is formed on a silicon substrate having superior suitability for mass production, defects and cracks occur easily due to the differences between the lattice constants and the coefficients of thermal expansion. Technology for making a high-quality crystal having few cracks on a substrate of silicon, etc., is desirable. Also, technology for reducing the warp of the substrate is desirable to improve the element characteristics and the yield in production.

BRIEF DESCRIPTION OF THE DRAWINGS

FIG. 13A to FIG. 13D are schematic views illustrating a nitride semiconductor element according to a third embodiment.

DETAILED DESCRIPTION

Figures 1A, 1B, 1C, 1D:
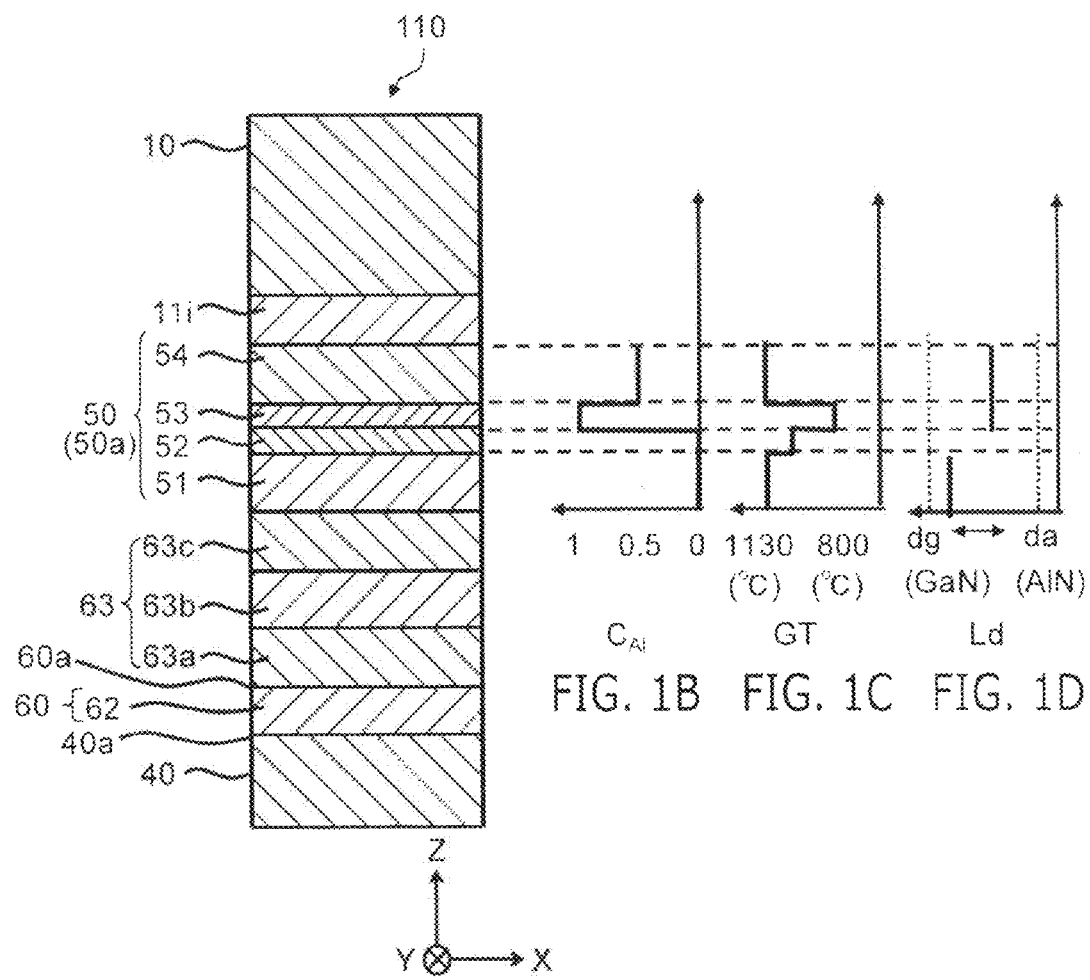
FIG. 1A to FIG. 1D are schematic views illustrating the nitride semiconductor element according to the first embodiment.

According to one embodiment, a nitride semiconductor element includes a functional layer and a stacked body. The stacked body includes a GaN intermediate layer, a low Al composition layer, a high Al composition layer, and a first Si-containing layer. The low Al composition layer includes a nitride semiconductor having a first Al composition ratio. The low Al composition layer is provided between the GaN intermediate layer and the functional layer. The high Al composition layer includes a nitride semiconductor having a second Al composition ratio. The high Al composition layer is provided between the GaN intermediate layer and the low Al composition layer. The second Al composition ratio is higher than the first Al composition ratio. The first Si-containing layer is provided between the GaN intermediate layer and the high Al composition layer.

According to one embodiment, a nitride semiconductor element includes a functional layer formed on a stacked body. The stacked body includes a GaN intermediate layer, a low Al composition layer, a high Al composition layer, and a first Si-containing layer. The low Al composition layer includes a nitride semiconductor having a first Al composition ratio. The low Al composition layer is provided between the GaN intermediate layer and the functional layer. The high Al composition layer includes a nitride semiconductor having a second Al composition ratio. The high Al composition layer is provided between the GaN intermediate layer and the low Al composition layer. The second Al composition ratio is higher than the first Al composition ratio. The first Si-containing layer is provided between the GaN intermediate layer and the high Al composition layer.

According to one embodiment, a nitride semiconductor element includes a functional layer, and a stacked body. The stacked body includes a GaN intermediate layer, a low Al composition layer, a high Al composition layer and a second Si-containing layer. The low Al composition layer includes a nitride semiconductor having a first Al composition ratio. The low Al composition layer is provided between the GaN intermediate layer and the functional layer. The high Al composition layer includes a nitride semiconductor having a second Al composition ratio. The high Al composition layer is provided between the GaN intermediate layer and the low Al composition layer. The second Al composition ratio is higher than the first Al composition ratio. The second Si-containing layer is provided between the low Al composition layer and the high Al composition layer.

According to one embodiment, a nitride semiconductor wafer includes a substrate, a functional layer, and a stacked body. The stacked body is provided between the substrate and the functional layer. The stacked body includes a GaN intermediate layer, a low Al composition layer, a high Al composition layer, and a first Si-containing layer. The low Al composition layer includes a nitride semiconductor having a first Al composition ratio. The low Al composition layer is provided between the GaN intermediate layer and the functional layer. The high Al composition layer includes a nitride semiconductor having a second Al composition ratio. The high Al composition layer is provided between the GaN intermediate layer and the low Al composition layer. The second Al composition ratio is higher than the first Al composition ratio. The first Si-containing layer is provided between the GaN intermediate layer and the high Al composition layer.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

The embodiment relates to a nitride semiconductor element. The nitride semiconductor element according to the embodiment includes a semiconductor device such as a semiconductor light emitting element, a semiconductor light receiving element, an electronic device, etc. The semiconductor light emitting element includes, for example, a light emitting diode (LED), a laser diode (LD), etc. The semiconductor light receiving element includes a photodiode (PD), etc. The electronic device includes, for example, a high electron mobility transistor (HEMT), a heterojunction bipolar transistor (HBT), a field effect transistor (FET), a Schottky barrier diode (SBD), etc.

FIG. 1A to FIG. 1D are schematic views illustrating the nitride semiconductor element according to the first embodiment.

FIG. 1A is a schematic cross-sectional view showing the nitride semiconductor element 110 according to the embodiment. FIG. 1B is a graph of an Al composition ratio $C_{Al}$ of a stacked body. FIG. 1C is a graph of a growth temperature GT (a formation temperature) of the stacked body. FIG. 1D is a graph of a lattice spacing Ld of the a-axis of the stacked body.

As shown in FIG. 1A, the nitride semiconductor element 110 according to the embodiment includes a foundation layer 60, a stacked body 50, and a functional layer 10. The foundation layer 60 has a major surface 60a. The stacked body 50 is provided between the major surface 60a of the foundation layer 60 and the functional layer 10. For example, the functional layer 10 is formed on the stacked body 50. The stacked body 50 includes a first stacked unit 50a.

In the embodiment, the functional layer 10 has at least one selected from, for example, a light emitting function, a photoelectric conversion mechanism, and a current switching function.

Here, a direction from the foundation layer 60 toward the functional layer 10 is taken as a Z-axis direction. One direction perpendicular to the Z-axis is taken as an X-axis direction. A direction perpendicular to the Z-axis direction and the X-axis direction is taken as a Y-axis direction. The functional layer 10 is stacked with the stacked body 50 along the Z-axis direction.

In the specification of the application, being "stacked" includes not only the state of overlapping in contact with each other but also the state of overlapping with another layer inserted therebetween. Further, being "provided on" includes not only being provided in direct contact but also being provided with another layer inserted therebetween.

In the example, the nitride semiconductor element 110 further includes a substrate 40. The stacked body 50 is provided between the substrate 40 and the functional layer 10. The foundation layer 60 is provided between the substrate 40 and the stacked body 50 (e.g., the first stacked unit 50a). The substrate 40 has a major surface 40a. The major surface 40a of the substrate 40 is substantially parallel to the major surface 60a of the foundation layer 60.

The substrate 40 includes, for example, silicon. For example, the substrate 40 is a Si (111) substrate. In the embodiment, in the case where the substrate 40 is a silicon substrate, the plane orientation of the substrate 40 may not be the (111) plane and may be, for example, the (11n) plane orientation (n being an integer) or the (100) plane. For example, the (110) plane is favorable because the lattice mismatch between the silicon substrate and the nitride semiconductor layer is small.

The substrate 40 may be a substrate including an oxide layer. For example, the substrate 40 may be a silicon-on-insulator (SOI) substrate, etc. The substrate 40 may include a material having a lattice constant that is different from the lattice constant of the functional layer 10. The substrate 40 may include a material having a coefficient of thermal expansion that is different from the coefficient of thermal expansion of the functional layer 10. For example, the substrate 40 may be a substrate of one selected from sapphire, spinel, GaAs, InP, ZnO, Ge, SiGe, GaN, aluminum nitride (AlN), and SiC.

For example, the foundation layer 60 is formed on the substrate 40. An AlGaN foundation layer 63 is formed on the foundation layer 60. The stacked body 50 is formed on the AlGaN foundation layer 63. In other words, the AlGaN foundation layer 63 is provided between the substrate 40 and the stacked body 50. The foundation layer 60 is provided between the AlGaN foundation layer 63 and the substrate 40.

The functional layer 10 is formed on the stacked body 50. The formation of these layers may be performed by epitaxial growth. For example, the major surface of these nitride semiconductor layers is the (0001) plane (c-plane).

The nitride semiconductor element according to the embodiment includes the functional layer 10 formed on the stacked body 50. There are cases where the nitride semiconductor element is used in a state in which at least a portion of the stacked body 50 is removed after the functional layer 10 is formed on the stacked body 50. For example, the nitride semiconductor element is used in a state in which the substrate 40, the foundation layer 60, the AlGaN foundation layer 63, the stacked body 50, and a portion of the functional layer 10 are removed.

In the case where the nitride semiconductor element is a light emitting element, the functional layer 10 includes, for example, an n-type semiconductor layer, a light emitting layer, and a p-type semiconductor layer.

The foundation layer 60 includes, for example, AlN. For example, the foundation layer 60 includes an AlN buffer layer 62. The AlN buffer layer 62 includes Al and N. It is favorable for the thickness of the AlN buffer layer 62 to be, for example, not less than 10 nanometers (nm) and not more than 400 nm, e.g., about 200 nm. The buffer layer is not limited to the AlN layer; and a GaN layer may be used. In the case where the GaN layer is used as the foundation layer 60, the thickness of the GaN layer is, for example, not less than 10 nm and not more than 50 nm. The thickness of the GaN layer is, for example, about 30 nm. A mixed crystal such as AlGaN, InGaN, etc., may be used as the foundation layer 60.

For example, AlN for which chemical reactions do not easily occur with the substrate 40 (the silicon substrate) is used as the foundation layer 60 that contacts the silicon. Thereby, for example, it is easy to solve the problems of meltback etching, etc., that occur due to reactions between the silicon and the gallium. It is favorable for at least a portion of the AlN used as the foundation layer 60 to include a monocrystal. For example, a monocrystalline AlN buffer layer 62 can be formed by performing epitaxial growth of AlN at a high temperature not less than 1000° C. In the case where the silicon substrate is used as the substrate 40, the difference between the coefficients of thermal expansion of the nitride semiconductor and the silicon substrate is greater than the difference between the coefficients of thermal expansion of the nitride semiconductor and a substrate of a material other than silicon. Therefore, the warp of the substrate 40 that occurs after the epitaxial growth is large; and cracks occur easily. By using an AlN layer including a monocrystal as the foundation layer 60, stress (strain) is formed inside the nitride semiconductor in the epitaxial growth; and the warp of the substrate after the growth ends can be reduced.

It is favorable for tensile stress (strain) to be formed in the AlN buffer layer 62. The formation of defects at the interface between the substrate 40 and the foundation layer 60 is suppressed by forming the tensile stress (strain) in the AlN buffer layer 62.

The foundation layer 60 may include indium (In). By the foundation layer 60 including In, the lattice mismatch between the foundation layer 60 and the substrate 40 (the silicon substrate) is relaxed; and the occurrence of the dislocations is suppressed. In the case where the foundation layer 60 includes In, desorption reactions of the In occur easily in the crystal growth. It is favorable for the In composition ratio to be set to be 50% or less. Thereby, a foundation layer 60 having good flatness can be obtained.

The AlGaN foundation layer 63 is formed on the AlN buffer layer 62. The AlGaN foundation layer 63 includes Al, Ga, and N.

The AlGaN foundation layer 63 includes $Al_xGa_{1-x}N$ ($0<x\le 1$). It is favorable for the thickness of the AlGaN foundation layer 63 to be, for example, not less than 100 nm and not more than 1000 nm, e.g., about 250 nm. It is favorable for the composition ratio of Al of the AlGaN foundation layer 63 to be, for example, not less than 0.1 and not more than 0.9, e.g., 0.25. Meltback etching is suppressed further by the AlGaN foundation layer 63. The compressive stress (strain) that is formed in the stacked body 50 can be increased by the AlGaN foundation layer 63.

In the case where multiple nitride semiconductor layers having different compositions are stacked, the nitride semiconductor layer (e.g., the AlGaN foundation layer 63) that is stacked on top is formed to match the lattice spacing (the length of the lattice) of the nitride semiconductor layer (e.g., the AlN buffer layer 62) that is formed on the bottom. Therefore, the actual lattice spacing of the nitride semiconductor layer is different from an unstrained lattice spacing (lattice constant).

In the specification of the application, "lattice constant" refers to the unstrained lattice spacing of the nitride semiconductor. In the specification of the application, "lattice spacing" refers to the length of the actual lattice of the nitride semiconductor layer that is formed. The lattice constant is, for example, a physical property constant. The lattice spacing is, for example, the length of the actual lattice of the nitride semiconductor layer included in the nitride semiconductor element that is formed. For example, the lattice spacing is determined from X-ray diffraction measurements.

At least a portion of the AlGaN foundation layer 63 has crystallinity. In other words, at least a portion of the AlGaN foundation layer 63 is not amorphous but is polycrystalline or monocrystalline. The AlGaN foundation layer 63, which has a lattice constant in an axis (a direction) perpendicular to the stacking direction that is larger than the lattice spacing of the AlN buffer layer 62, is formed on the monocrystalline AlN buffer layer 62. Thereby, compressive stress (strain) is formed inside the AlGaN foundation layer 63 that has crystallinity.

The lattice spacing in the axis (the direction) perpendicular to the stacking direction of the AlGaN foundation layer 63 in which the compressive stress (strain) is formed is smaller than the unstrained lattice spacing (lattice constant). By forming the compressive stress (strain), the tensile stress (strain) that occurs due to the difference between the coefficients of thermal expansion of the nitride semiconductor and the silicon substrate in the cooling process after the crystal growth can be reduced. Thereby, the occurrence of warp and cracks of the substrate 40 can be suppressed.

Because the AlGaN foundation layer 63 has crystallinity, three-dimensional growth is easy for the GaN layer that is a portion of the stacked body 50 formed on the AlGaN foundation layer 63. Thereby, the dislocations are reduced easily. Whether or not the AlGaN foundation layer 63 has crystallinity can be evaluated by, for example, observing the diffraction peaks by X-ray diffraction measurements, etc. For example, the evaluation can be performed by observing the diffraction peaks of a crystal plane (e.g., the (0002) plane) perpendicular to the growth direction (the stacking direction).

It is favorable for the AlGaN foundation layer 63 to have a flat surface without pits. A larger compressive stress (strain) is easily formed in the GaN layer that is a portion of the stacked body 50 by forming the GaN layer on the flat surface.

The dislocations at the interface between the AlN buffer layer 62 and the AlGaN foundation layer 63 can be reduced by forming the AlGaN foundation layer 63 on the AlN buffer layer 62.

The AlGaN foundation layer 63 may be one layer or may include multiple layers. In the example, the AlGaN foundation layer 63 includes a first AlGaN foundation layer 63a, a second AlGaN foundation layer 63b, and a third AlGaN foundation layer 63c. The number of layers included in the AlGaN foundation layer 63 may be two, four, or more. The second AlGaN foundation layer 63b is provided on the first AlGaN foundation layer 63a. The third AlGaN foundation layer 63c is provided on the second AlGaN foundation layer 63b. The compressive stress (strain) that is formed inside the AlGaN foundation layer 63 can be increased by forming multiple layers as the AlGaN foundation layer 63. In such a case, it is favorable for stacking to be performed so that the Al composition ratio decreases in the upward direction from the foundation layer 60 (e.g., in the direction from the foundation layer 60 toward the functional layer 10). That is, it is favorable for the Al composition ratio of the second AlGaN foundation layer 63b to be lower than the Al composition ratio of the first AlGaN foundation layer 63a; and it is favorable for the Al composition ratio of the third AlGaN foundation layer 63c to be lower than the Al composition ratio of the second AlGaN foundation layer 63b.

For example, in the case where the foundation layer 60 includes AlN, it is favorable for the lattice mismatch in a direction (e.g., the a-axis) perpendicular to the stacking direction between the layers of the multiple layers of the AlGaN foundation layers 63 that contact each other to be equal to the lattice mismatch between AlN and GaN at room temperature subdivided over the number of stacks of the AlGaN foundation layers 63 at a uniform spacing. For example, the Al composition ratio of each of the multiple layers of the AlGaN foundation layers 63 is set by considering the lattice mismatch.

In other words, for example, it is favorable for the value of the lattice mismatch of each layer to be about the lattice mismatch between AlN and GaN at room temperature divided by the sum of 1 and the number of stacks. Thereby, it is favorable to set the Al composition ratio of the AlGaN foundation layer 63. Thereby, the compressive stress (strain) that is formed inside the AlGaN foundation layer 63 is increased easily.

The lattice mismatch of the a-axis between AlN and GaN at room temperature is about 2.1%. Thereby, for example, in the case of three layers of AlGaN foundation layers 63, the AlGaN foundation layers 63 can be formed to have Al composition ratios so that the lattice mismatch of the a-axis of each layer is about 0.5% (e.g., not less than 0.4% and not more than 0.6%).

For example, in the AlGaN foundation layers 63, layers of AlGaN having an Al composition ratio of about 0.55, AlGaN having an Al composition ratio of about 0.3, and AlGaN having an Al composition ratio of about 0.15 may be stacked in this order. For example, the Al composition ratio of the first AlGaN foundation layer 63a is about 0.55. The Al composition ratio of the second AlGaN foundation layer 63b is about 0.3. The Al composition ratio of the third AlGaN foundation layer 63c is about 0.15. If the Al composition ratios are set to be within the range of ±0.05 from the values recited above (about 0.55, about 0.3, and about 0.15), the lattice mismatch of the a-axis of each layer can be about 0.5% (e.g., not less than 0.4% and not more than 0.6%).

For example, in the case where two layers of AlGaN foundation layers 63 are formed, the AlGaN foundation layers 63 may be formed to have Al composition ratios so that the lattice mismatch of the a-axis of each layer is about 0.7% (e.g., not less than 0.6% and not more than 0.8%).

For example, in the AlGaN foundation layers 63, AlGaN having an Al composition ratio of about 0.45 and AlGaN having an Al composition ratio of about 0.18 may be stacked in this order. For example, the Al composition ratio of the first AlGaN foundation layer 63a is about 0.45. The Al composition ratio of the second AlGaN foundation layer 63b is about 0.18.

The reason that the difference is not constant between the Al composition ratios of the AlGaN foundation layers 63 (in the example, the first AlGaN foundation layer 63a, the second AlGaN foundation layer 63b, and the third AlGaN foundation layer 63c) is because strain (stress) is formed inside the AlGaN foundation layers 63. The lattice mismatch of the AlGaN foundation layers 63 can be calculated by X-ray diffraction measurements at room temperature.

In the case where multiple layers are formed as the AlGaN foundation layer 63, it is favorable for the film thickness to increase as the layers are stacked upward from the foundation layer 60 (e.g., in the direction from the foundation layer 60 toward the functional layer 10). That is, it is favorable for the film thickness of the second AlGaN foundation layer 63b to be thicker than the film thickness of the first AlGaN foundation layer 63a; and it is favorable for the film thickness of the third AlGaN foundation layer 63c to be thicker than the film thickness of the second AlGaN foundation layer 63b. Thereby, the compressive stress (strain) that is formed inside the AlGaN foundation layer 63 is increased easily.

The stacked body 50 includes a GaN intermediate layer 51 (a GaN intermediate layer 51a of the first stacked unit 50a), a first Si-containing layer 52, a high Al composition layer 53 (a high Al composition layer 53a of the first stacked unit 50a), and a low Al composition layer 54 (a low Al composition layer 54a of the first stacked unit 50a).

The GaN intermediate layer 51 is provided between the substrate 40 and the functional layer 10. The low Al composition layer 54 is provided between the GaN intermediate layer 51 and the functional layer 10. The high Al composition layer 53 is provided between the GaN intermediate layer 51 and the low Al composition layer 54. The first Si-containing layer 52 is provided between the GaN intermediate layer 51 and the high Al composition layer 53.

The low Al composition layer 54 includes a nitride semiconductor having a first Al composition ratio. The high Al composition layer 53 includes a nitride semiconductor having a second Al composition ratio. The second Al composition ratio is higher than the first Al composition ratio.

The unstrained lattice spacing (lattice constant) of a first axis (e.g., the a-axis) perpendicular to the stacking direction of the low Al composition layer 54 is smaller than the unstrained lattice spacing (lattice constant) of the first axis of the GaN intermediate layer 51. The unstrained lattice spacing (lattice constant) of the first axis (e.g., the a-axis) perpendicular to the stacking direction of the high Al composition layer 53 is smaller than the unstrained lattice spacing (lattice constant) of the first axis of the low Al composition layer 54.

The high Al composition layer 53 (the high Al composition layer 53a of the first stacked unit 50a) includes, for example, at least one selected from $Al_{x1}Ga_{1-x1}N$ ($0 < x1 \leq 1$) and AlN. The high Al composition layer 53 (the high Al composition layer 53a of the first stacked unit 50a) includes, for example, $Al_{x1}Ga_{1-x1}N$ ($0 < x1 \leq 1$) or AlN. The low Al composition layer 54 (the low Al composition layer 54a of the first stacked unit 50a) includes, for example, $Al_{y1}Ga_{1-y1}N$ ($0 < y1 < 1$ and $y1 < x1$).

When forming the GaN intermediate layer 51 (the GaN intermediate layer 51a of the first stacked unit 50a) which has a large lattice constant compared to the lattice spacing of the AlGaN foundation layer 63, the GaN intermediate layer 51 is formed to have lattice matching with the lattice spacing of the AlGaN foundation layer 63; and compressive stress is formed in the GaN intermediate layer 51. As the film thickness of the GaN intermediate layer 51 increases, lattice relaxation occurs in the GaN intermediate layer 51; and the lattice spacing of the GaN intermediate layer 51 approaches the lattice spacing of unstrained GaN. When the actual lattice spacing of the GaN intermediate layer 51 becomes substantially the same as the lattice spacing of unstrained GaN (the lattice constant of GaN), compressive stress applied to the GaN intermediate layer 51 does not occur even when increasing the film thickness further; and the GaN intermediate layer 51 is easily affected by the tensile stress from the substrate 40. By appropriately setting the thickness of the GaN intermediate layer 51, the state can be maintained in which the lattice spacing of the first axis (e.g., the a-axis) of the GaN is smaller than the lattice spacing of the first axis (e.g., the a-axis) of unstrained GaN (the lattice constant of GaN). It is favorable for the thickness of the GaN intermediate layer 51 to be, for example, not less than 100 nm and not more than 3000 nm, e.g., about 400 nm.

The first Si-containing layer 52 contains silicon (Si). For example, the first Si-containing layer 52 includes a compound (e.g., silicon nitride (SiN)) including nitrogen and Si. The first Si-containing layer 52 may include a delta-doped layer of Si. The high Al composition layer 53 is formed on the first Si-containing layer 52. The Si concentration and/or thickness of the first Si-containing layer 52 has fluctuation in the plane (in the X-Y plane) perpendicular to the stacking direction. The first Si-containing layer 52 is selectively grown on at least one of portions having low Si concentrations or portions having thin thicknesses. Thereby, the high Al composition layer 53 is grown three-dimensionally.

By growing the high Al composition layer 53 three-dimensionally, the high Al composition layer 53 is relaxed easily. Thereby, compressive stress is formed easily in the layer (e.g., the functional layer 10) formed on the high Al composition layer 53. The coverage of the first Si-containing layer 52 on the GaN intermediate layer 51 is high. Thereby, for example, the degree of the relaxation is increased.

In the example, the first Si-containing layer 52 contacts the GaN intermediate layer 51. Because the first Si-containing layer 52 contacts the GaN intermediate layer 51, the high Al composition layer 53 is relaxed easily; and the compressive stress (strain) that is applied to the layer (e.g., the functional layer 10) formed on the high Al composition layer 53 increases.

For example, the thickness of the first Si-containing layer 52 is a thickness corresponding to 1 atomic layer. For example, it is favorable for the thickness of the first Si-containing layer 52 to be a thickness corresponding to not less than 0.2 atomic layers and not more than 2.5 atomic layers. In the case where the thickness of the first Si-containing layer 52 is thinner than a thickness corresponding to 0.2 atomic layers, the three-dimensional growth of the high Al composition layer 53 does not occur easily; and the relaxation decreases. On the other hand, in the case where the thickness of the first Si-containing layer 52 is thicker than a thickness corresponding to 2.5 atomic layers, regions increase where coherent growth of the high Al composition layer 53 does not occur; fluctuation of the crystal axis occurs; and the crystal quality decreases.

The thickness of the first Si-containing layer 52 may be nonuniform. The first Si-containing layer 52 may be a layer having a discontinuous island configuration, etc. The first Si-containing layer 52 may be a layer in which openings are provided.

The thickness of the first Si-containing layer 52 is obtained by, for example, direct observation using a transmission electron microscope (TEM) image or a scanning electron microscope (SEM) image. When performing the observation using SEM, the cross section of the nitride semiconductor layer or the substrate when cut by a cleavage plane is used. The thickness of the first Si-containing layer 52 is obtained from secondary ion mass spectrometry (SIMS). When the Si concentration inside the layer is about $2 \times 10^{20}$/cubic centimeter (/cm$^3$) in secondary ion mass spectrometry, the thickness of the first Si-containing layer 52 corresponds to 1 atomic layer. The Si concentration corresponds to a Si surface density of about $1 \times 10^{15}$/square centimeter (/cm$^2$) when converted into surface density.

It is favorable for the Al composition ratio of the high Al composition layer 53 to be, for example, not less than 0.5 and not more than 1.0, e.g., about 1.0. In the case where the Al composition ratio of the high Al composition layer 53 is less than 0.5, it is difficult for the high Al composition layer 53 to be relaxed sufficiently. It is favorable for the thickness of the high Al composition layer 53 to be, for example, not less than 5 nm and not more than 100 nm, e.g., about 12 nm. In the case where the thickness of the high Al composition layer 53 is thinner than 5 nm, it is difficult for the high Al composition layer 53 to be relaxed sufficiently. In the case where the thickness of the high Al composition layer 53 is thicker than 100 nm, the crystal quality of the high Al composition layer 53 degrades easily. For example, the surface flatness degrades; and pits occur easily. It is more favorable for the thickness of the high Al composition layer 53 to be not less than 10 nm and not more than 50 nm. In the case where the thickness of the high Al composition layer 53 is 50 nm or less, the degradation of the crystal quality can be suppressed further.

The low Al composition layer 54 includes, for example, Al, Ga, and N. It is favorable for the Al composition ratio of the low Al composition layer 54 to be, for example, not less than 0.1 and not more than 0.9, e.g., about 0.5. It is favorable for the thickness of the low Al composition layer 54 to be, for example, not less than 5 nm and not more than 100 nm, e.g., about 25 nm. In the case where the thickness of the low Al composition layer 54 is thinner than 5 nm, the dislocations are not reduced easily. In the case where the thickness of the low Al composition layer 54 is thicker than 100 nm, the reduction of the dislocations becomes saturated; and cracks occur easily. It is more favorable for the thickness of the low Al composition layer 54 to be less than 50 nm. The thickness of the low Al composition layer 54 is set to be less than 50 nm. Thereby, the dislocations can be reduced efficiently.

In the case where the nitride semiconductor element 110 is a light emitting element, the functional layer 10 includes, for example, an n-type semiconductor layer 11 that is formed on the stacked body 50, a light emitting layer 13 that is formed on the n-type semiconductor layer 11, and a p-type semiconductor layer 12 that is formed on the light emitting layer 13. The light emitting layer 13 includes multiple barrier layers of GaN, and an InGaN (e.g., $In_{0.15}Ga_{0.85}N$) layer provided between the barrier layers. The light emitting layer 13 has a MQW (Multi-Quantum Well) structure or a SQW (Single-Quantum Well) structure. It is favorable for the thickness of the functional layer 10 to be, for example, not less than 1 micrometer (μm) and not more than 5 μm, e.g., about 3.5 μm.

The nitride semiconductor element 110 may include, for example, a nitride semiconductor element of a gallium nitride (GaN) HEMT (High Electron Mobility Transistor). In such a case, the functional layer 10 has, for example, a stacked structure of an undoped $Al_{z1}Ga_{1-z1}N$ ($0 \le z1 \le 1$) layer not including an impurity and an undoped or n-type $Al_{z2}Ga_{1-z2}N$ ($0 \le z2 \le 1$ and $z1 < z2$) layer.

A GaN layer 11i (an undoped GaN layer) may be provided on the stacked body 50 (e.g., between the stacked body 50 and the functional layer 10). By providing the GaN layer 11i (the undoped GaN layer), compressive strain (stress) is formed in the GaN layer 11i; and cracks are suppressed further.

In FIG. 1B, FIG. 1C, and FIG. 1D, the vertical axis is the Z-axis direction position.

The horizontal axis of FIG. 1B is the Al composition ratio $C_{Al}$. In the stacked body 50 as shown in FIG. 1B, the Al composition ratio $C_{Al}$ is substantially 0 in the GaN intermediate layer 51, substantially 1 in the high Al composition layer 53, and greater than 0 and less than 1 in the low Al composition layer 54.

The horizontal axis of FIG. 1C is a growth temperature GT. As shown in FIG. 1C, for example, the growth temperature GT of the GaN intermediate layer 51 is high. By setting the growth temperature GT of the GaN intermediate layer 51 to be high, the lattice relaxation is suppressed; and the compressive stress that is formed in the GaN intermediate layer 51 can be increased. It is favorable for the growth temperature GT of the GaN intermediate layer 51 to be, for example, not less than 1000° C. and not more than 1200° C., e.g., about 1130° C.

The growth temperature GT of the first Si-containing layer 52 is not more than the growth temperature GT of the GaN intermediate layer 51. By setting the growth temperature GT of the first Si-containing layer 52 to be not more than the growth temperature GT of the GaN intermediate layer 51, the decrease of the flatness of the GaN intermediate layer 51 by etching when forming the first Si-containing layer 52 can be suppressed. It is favorable for the growth temperature GT of the first Si-containing layer 52 to be, for example, not less than 900° C. and not more than 1150° C., e.g., about 1100° C.

The growth temperature GT of the high Al composition layer 53 is low. It is favorable for the growth temperature GT of the high Al composition layer 53 to be, for example, not less than 500° C. and not more than 1050° C., e.g., about 800° C. It is more favorable to be not less than 600° C. and not more than 850° C. In the case where the growth temperature GT of the high Al composition layer 53 is lower than 500° C., impurities are assimilated easily. Also, cubic AlGaN, etc., grows; and crystal dislocations undesirably occur excessively. Also, the crystal quality of the high Al composition layer 53 undesirably degrades excessively. In the case where the growth temperature GT of the high Al composition layer 53 is higher than 1050° C., lattice relaxation does not occur easily. Therefore, the strain is not relaxed; and tensile strain is introduced easily to the high Al composition layer 53. Further, when forming the low Al composition layer 54 and/or the functional layer 10 on the high Al composition layer 53, the compressive stress is not applied appropriately; and cracks occur easily in the cooling process after the crystal growth. Conversely, in the case where the growth temperature GT of the high Al composition layer 53 is, for example, 800° C., lattice relaxation occurs easily in the high Al composition layer 53. As a result, the high Al composition layer 53 can be formed substantially without the effects of the strain from the GaN intermediate layer 51 and/or the foundation layer 60. In other words, the tensile strain from the GaN intermediate layer 51 and/or the foundation layer 60 is not easily applied from the initial formation of the high Al composition layer 53. Thus, a high Al composition layer 53 having lattice relaxation is formed on the first Si-containing layer 52.

The growth temperature GT of the low Al composition layer 54 is high. It is favorable for the growth temperature GT of the low Al composition layer 54 to be, for example, not less than 300° C. and not more than 1200° C., e.g., 1130° C.

The horizontal axis of FIG. 1D is the lattice spacing Ld of the a-axis. FIG. 1D shows the lattice spacing dg (e.g., 0.3189 nm) of the a-axis of unstrained GaN and the lattice spacing da (e.g., 0.3112 nm) of the a-axis of unstrained AlN. The lattice spacing da of the a-axis (the first axis) of unstrained $Al_{x1}Ga_{1-x1}N$ ($0<x1\leq1$) corresponds to the lattice constant of the a-axis (the first axis) of $Al_{x1}Ga_{1-x1}N$ ($0<x1\leq1$). For example, in the case where the high Al composition layer 53 is AlN, the lattice spacing da of the a-axis (the first axis) of the unstrained high Al composition layer 53 corresponds to the lattice constant of the a-axis (the first axis) of AlN. The lattice spacing dg of unstrained GaN is larger than the lattice spacing da of unstrained AlN.

As shown in FIG. 1D, the lattice spacing of the a-axis (the first axis) of the GaN intermediate layer 51 is large; and the lattice spacing of the a-axis (the first axis) of the high Al composition layer 53 is small. The actual lattice spacing of the a-axis (the first axis) of the GaN intermediate layer 51 is, for example, smaller than the lattice spacing dg of the a-axis (the first axis) of unstrained GaN. The actual lattice spacing of the a-axis (the first axis) of the high Al composition layer 53 is, for example, larger than the lattice spacing da of the a-axis (the first axis) of unstrained $Al_{x1}Ga_{1-x1}N$ ($0<x1\leq1$). In the case where the high Al composition layer 53 is AlN, the actual lattice spacing of the high Al composition layer 53 is, for example, larger than the lattice spacing da of the a-axis (the first axis) of unstrained AlN. In other words, the lattice spacing of the a-axis (the first axis) of the stacked body 50 is largest in the GaN intermediate layer 51 and abruptly decreases in the high Al composition layer 53. The lattice spacing of the a-axis (the first axis) of the low Al composition layer 54 is the same as or larger than the lattice spacing of the a-axis (the first axis) of the high Al composition layer 53.

The composition ratio of the Al of the low Al composition layer 54 is not more than a relaxation rate α of the high Al composition layer 53.

When the composition ratio of the Al of the low Al composition layer 54 is larger than the relaxation rate α of the high Al composition layer 53, tensile strain (stress) occurs in the low Al composition layer 54; and cracks occur easily. Lattice relaxation occurs; and dislocations increase easily.

The relaxation rate α of $Al_{x1}Ga_{1-x1}N$ ($0<x1\leq1$) which is the high Al composition layer 53 is set to be the ratio of the absolute value of the difference between the lattice spacing dg of the first axis (e.g., the a-axis) of unstrained GaN and an actual lattice spacing Da of the first axis (e.g., the a-axis) of the high Al composition layer 53 (the high Al composition layer 53a of the first stacked unit 50a) to the absolute value of the difference between the lattice spacing dg of the first axis (e.g., the a-axis) of unstrained GaN and the lattice spacing da of the first axis (e.g., the a-axis) of unstrained $Al_{x1}Ga_{1-x1}N$ ($0<x1\leq1$). In other words, the relaxation rate α of the high Al composition layer 53 is |dg−Da|/|dg−da|. The lattice spacing dg of the first axis (e.g., the a-axis) of unstrained corresponds to the lattice constant of GaN. The lattice spacing da of the first axis (e.g., the a-axis) of unstrained $Al_{x1}Ga_{1-x1}N$ ($0<x1\leq1$) corresponds to the lattice constant of the first axis (e.g., the a-axis) of $Al_{x1}Ga_{1-x1}N$ ($0<x1\leq1$).

The lattice spacing (the lattice constant) of the first axis of unstrained $Al_xGa_{1-x}N$ is, for example, the value calculated from the lattice spacing (the lattice constant) of the first axis of unstrained AlN and the lattice spacing (the lattice constant) of the first axis of unstrained GaN using Vegard's law.

In the nitride semiconductor element 110 according to the embodiment, the stacked body 50 is provided between the functional layer 10 and the foundation layer 60. The stacked body 50 has a structure in which the GaN intermediate layer 51, the first Si-containing layer 52, the high Al composition layer 53, and the low Al composition layer 54 are stacked in this order. Thereby, in the crystal growth, compressive stress is formed in the stacked body and in the functional layer formed on the stacked body; and an effect is obtained in which the occurrence of cracks is suppressed. Therefore, cracks in the functional layer 10 are reduced. According to the nitride semiconductor element 110, a high-quality nitride semiconductor element is obtained that has few cracks and is formed on the substrate 40 (e.g., a silicon substrate).

FIG. 2A to FIG. 2D are schematic views illustrating another nitride semiconductor element according to the first embodiment.

Figures 2A, 2B, 2C, 2D:
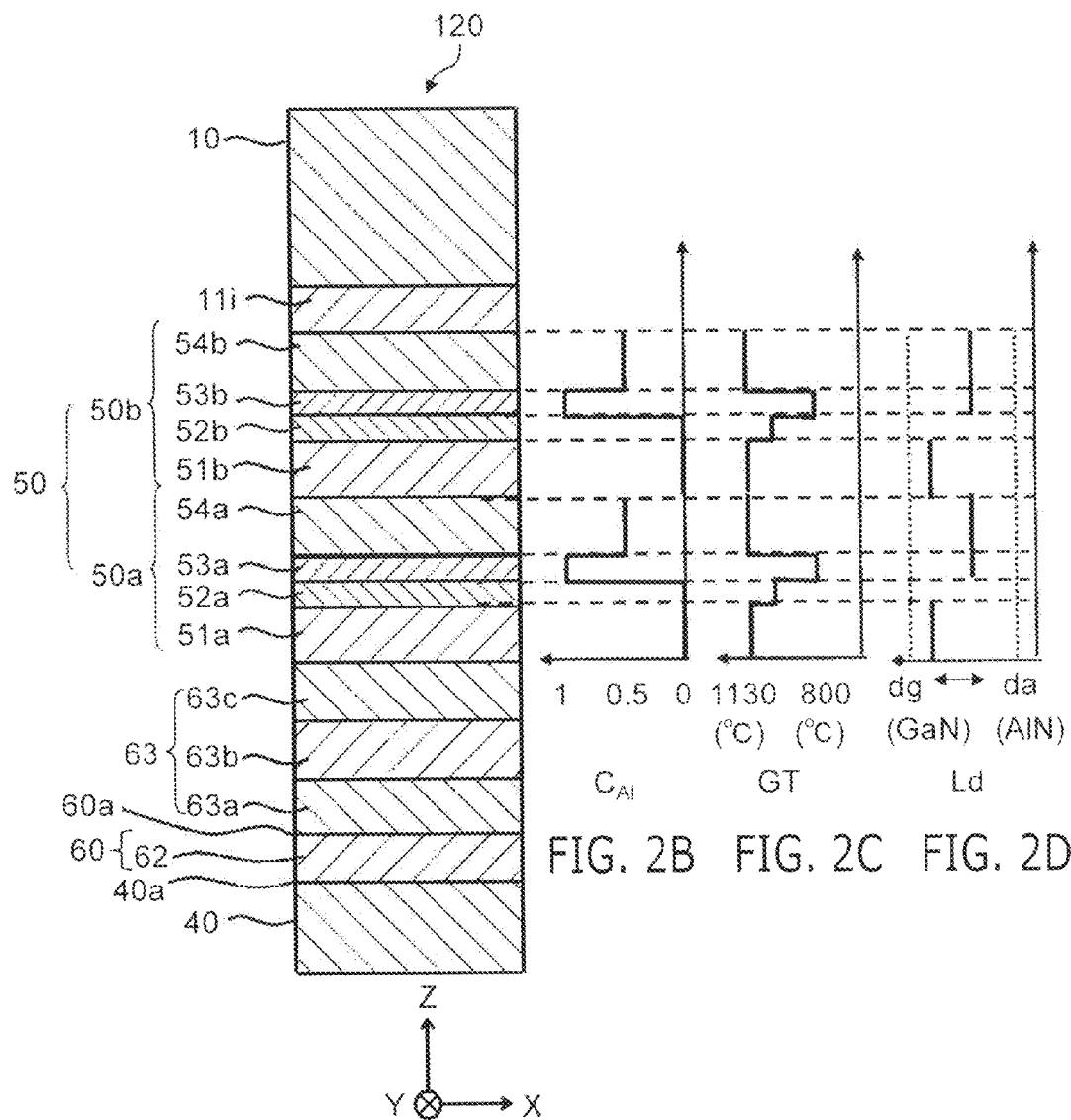
FIG. 2A to FIG. 2D are schematic views illustrating another nitride semiconductor element according to the first embodiment.

FIG. 2A is a schematic cross-sectional view showing the nitride semiconductor element 120 according to the embodiment. FIG. 2B to FIG. 2D are graphs of the Al composition ratio ($C_{Al}$), the growth temperature GT, and the lattice spacing Ld of the a-axis of the stacked body, respectively.

As shown in FIG. 2A, the nitride semiconductor element 120 includes the foundation layer 60, the stacked body 50, and the functional layer 10. The configuration of the foundation layer 60 and the configuration of the functional layer 10 are similar to those described in regard to the nitride semiconductor element 110, and a description is omitted. In such a case as well, the GaN layer 11i (the undoped GaN layer) may be provided between the stacked body 50 and the functional layer 10.

In the nitride semiconductor element 120, the configuration of the stacked body 50 is different from that of the nitride semiconductor element 110. The stacked body 50 will now be described.

In the nitride semiconductor element 120, the stacked body 50 includes the first stacked unit 50a and a second stacked unit 50b. The first stacked unit 50a is provided between the foundation layer 60 and the functional layer 10. The second stacked unit 50b is provided between the first stacked unit 50a and the functional layer 10.

The first stacked unit 50a includes the GaN intermediate layer 51a of the first stacked unit 50a that is provided on the foundation layer 60, a first Si-containing layer 52a of the first stacked unit that is provided on the GaN intermediate layer 51a of the first stacked unit 50a, the high Al composition layer 53a of the first stacked unit 50a that is provided on the first Si-containing layer 52a of the first stacked unit 50a, and the low Al composition layer 54a of the first stacked unit 50a that is provided on the high Al composition layer 53a of the first stacked unit 50a.

The second stacked unit 50b includes a GaN intermediate layer 51b of the second stacked unit 50b that is provided on the foundation layer 60, a first Si-containing layer 52b of the second stacked unit 50b that is provided on the GaN intermediate layer 51b of the second stacked unit 50b, a high Al composition layer 53b of the second stacked unit 50b that is provided on the first Si-containing layer 52b of the second stacked unit 50b, and a low Al composition layer 54b of the second stacked unit 50b that is provided on the high Al composition layer 53b of the second stacked unit 50b.

The configuration of the GaN intermediate layer 51a of the first stacked unit 50a and the configuration of the GaN intermediate layer 51b of the second stacked unit 50b are similar to the configuration of the GaN intermediate layer 51 described in regard to the nitride semiconductor element 110. The configuration of the first Si-containing layer 52a of the first stacked unit 50a and the configuration of the first Si-containing layer 52b of the second stacked unit 50b are similar to the configuration of the first Si-containing layer 52 described in regard to the nitride semiconductor element 110. The configuration of the high Al composition layer 53a of the first stacked unit 50a and the configuration of the high Al composition layer 53b of the second stacked unit 50b are similar to the configuration of the high Al composition layer 53 described in regard to the nitride semiconductor element 110. The configuration of the low Al composition layer 54a of the first stacked unit 50a and the configuration of the low Al composition layer 54b of the second stacked unit 50b are similar to the configuration of the low Al composition layer 54 described in regard to the nitride semiconductor element 110.

In the nitride semiconductor element 120, two sets (periods) of the set that includes a GaN intermediate layer, a first Si-containing layer, a high Al composition layer, and a low Al composition layer are provided. The embodiment is not limited thereto; and the number of sets (periods) may be three or more.

In the nitride semiconductor element 120 as well, a nitride semiconductor element is obtained that has few cracks and is formed on the substrate 40 (e.g., a silicon substrate).

In the nitride semiconductor element 120, the configuration of the second stacked unit 50b may be different from the configuration of the first stacked unit 50a. For example, the thickness of the GaN intermediate layer 51b of the second stacked unit 50b may be thicker than the thickness of the GaN intermediate layer 51a of the first stacked unit 50a. The structure is changed according to the change of the amount of the strain that is stored as the stacking is performed. Thereby, cracks and dislocations can be reduced.

Thus, the stacked body 50 may have a structure in which the GaN intermediate layer 51, the first Si-containing layer 52, the high Al composition layer 53, and the low Al composition layer 54 are multiply stacked periodically in this order. Thereby, compressive stress is applied during the crystal growth; and the occurrence of cracks is suppressed further. The cracks in the functional layer 10 are reduced further.

Figure 3A:
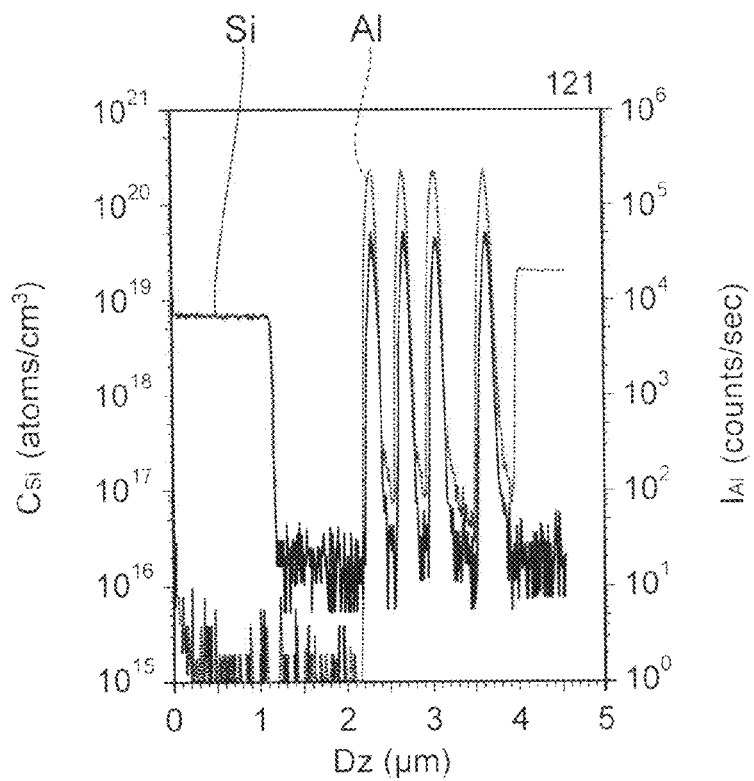
FIG. 3A and FIG. 3B are graphs of another nitride semiconductor element according to the first embodiment.
Figure 3B:
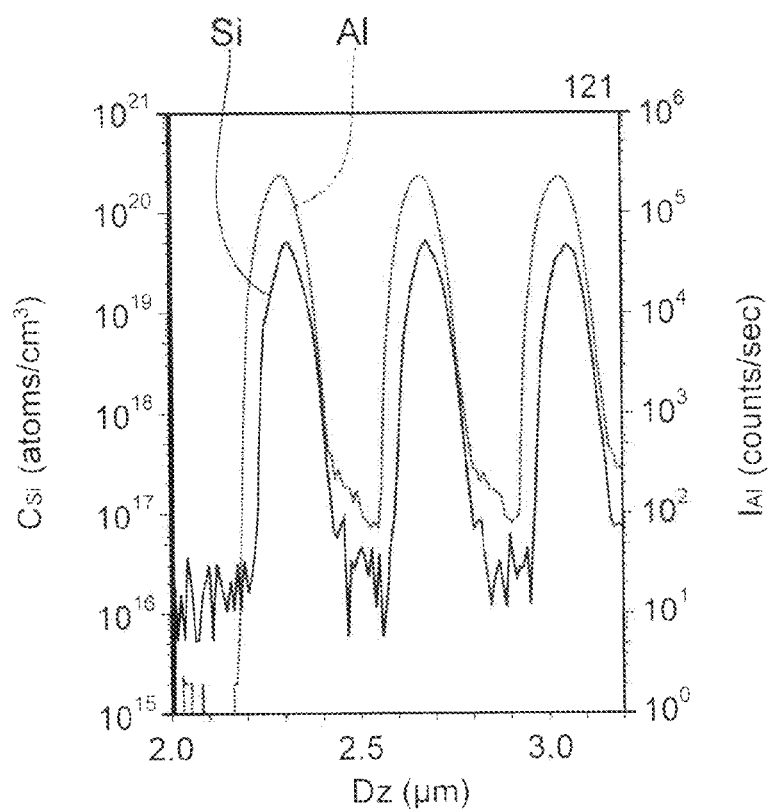

FIG. 3A and FIG. 3B are graphs of another nitride semiconductor element according to the first embodiment.

FIG. 3A and FIG. 3B show measurement results of the nitride semiconductor element 121 obtained by SIMS. In FIG. 3A and FIG. 3B, the left vertical axis is a concentration $C_{Si}$ of Si. In FIG. 3A and FIG. 3B, the right vertical axis is a secondary ion intensity $I_{Al}$ of Al. In FIG. 3A and FIG. 3B, the horizontal axis is a depth Dz (μm) along the Z-axis direction of the sample. The position of the functional layer 10 is where Dz=0. The direction in which Dz increases corresponds to the direction from the functional layer 10 toward the substrate 40.

The substrate 40, the foundation layer 60, the AlGaN foundation layer 63, the stacked body 50, the GaN layer 11i, and the functional layer 10 are provided in the nitride semiconductor element 121. The configurations described in regard to the nitride semiconductor element 120 are applicable to the substrate 40, the foundation layer 60, the AlGaN foundation layer 63, the GaN layer 11i, and the functional layer 10. In the nitride semiconductor element 121, the number of periods of stacks of the stacked body 50 is 4. In other words, four sets (periods) of the set that includes the GaN intermediate layer 51, the first Si-containing layer 52, the high Al composition layer 53, and the low Al composition layer 54 are provided.

FIG. 3A shows data of the functional layer 10, the GaN layer 11i, and the stacked body 50. FIG. 3B is an enlarged portion of FIG. 3A. FIG. 3B shows data of the stacked body 50.

For example, the peak of the Si concentration $C_{Si}$ corresponds to the first Si-containing layer 52. The peak of the secondary ion intensity $I_{Al}$ of Al corresponds to, for example, the high Al composition layer 53. As shown in FIG. 3B, the peak positions of the Si concentration $C_{Si}$ and the peak positions of the secondary ion intensity $I_{Al}$ of Al are different from each other. This indicates the existence of the first Si-containing layer 52.

In the example, the concentration $C_{Si}$ of the first Si-containing layer 52 is about $5.1 \times 10^{19}$/cubic centimeter (/cm$^3$). In such a case, the thickness of the first Si-containing layer 52 is a thickness corresponding to 0.3 atomic layers. Such a concentration $C_{Si}$ is about $3.5 \times 10^{14}$/square centimeter (/cm$^2$) when converted to surface density. For example, the Si concentration $C_{Si}$ of the first Si-containing layer 52 is not less than $2.5 \times 10^{19}$/cm$^3$ and not more than $5.0 \times 10^{20}$/cm$^3$. For example, the thickness of the first Si-containing layer 52 is not less than 0.1 nm and less than 20 nm. It is favorable for the thickness of the first Si-containing layer 52 to be not less than 0.2 nm and not more than 4 nm.

According to the measurement conditions such as the sputter rate, etc., in SIMS analysis, the Si concentration may be observed to have spreading in the thickness (depth) direction. In such a case, for example, the sum total of the Si concentration (the integral in the thickness direction of Si atoms) in the region up to where the Si concentration decreases to a value of 10% of the maximum value of the Si concentration in the region corresponding to the first Si-containing layer 52 can be considered to be the number of Si atoms per unit surface area (the Si surface density) included in each of the first Si-containing layers 52.

The thickness of the first Si-containing layer 52 can be estimated using the sum total (the Si surface density) of the Si concentration. Namely, the thickness of the first Si-containing layer 52 can be estimated as the thickness of a GaN layer when the Ga atoms (the group III atoms) of the GaN layer are used to uniformly replace the Si atoms inside the first Si-containing layer 52.

In the specification of the application, the thickness of the first Si-containing layer 52 is considered to be 1 atomic layer when the number of the Ga atoms substituted for the Si atoms inside the first Si-containing layer 52 corresponds to 1 atomic layer of the GaN layer.

For example, the surface density of the Ga atoms (the group III atoms) in the (0001) plane of the GaN layer is about $1 \times 10^{15}/cm^2$. Accordingly, in the case where the surface density of the Si inside the film is about $1 \times 10^{15}/cm^2$, the thickness of the first Si-containing layer 52 corresponds to 1 atomic layer.

In SIMS analysis, for example, a peak value of the Si concentration of $2 \times 10^{20}/cm^3$ and spreading having a width of 200 nm correspond to a Si surface density of about $1 \times 10^{15}/cm^2$ when converting to surface density.

In the example, the peak (the maximum value) of the Si concentration of the first Si-containing layer 52 is $5.1 \times 10^{19}/$ cubic centimeter ($/cm^3$). The width of the peak up to where the Si concentration decreases to the value of 10% of the peak value is about 140 nm. The overall Si concentration (the integral of the Si concentration in the thickness direction) in this region is $3.5 \times 10^{14}/$square centimeter ($/cm^2$) and corresponds to the Si surface density of the first Si-containing layer 52.

Figure 4:
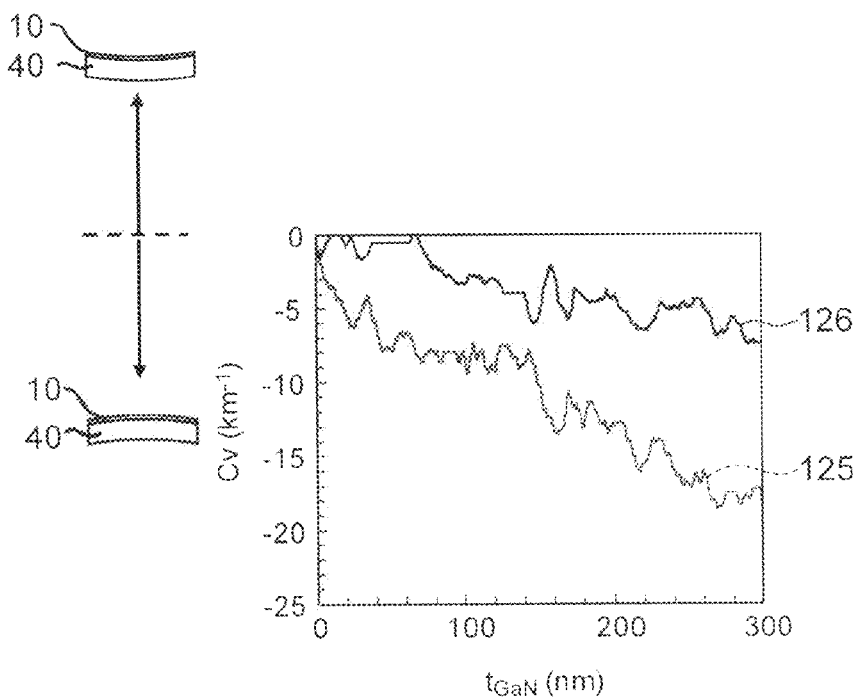
FIG. 4 is a graph of characteristics of nitride semiconductor elements.

FIG. 4 is a graph of characteristics of nitride semiconductor elements.

FIG. 4 shows the warp of the substrate during the crystal growth for the nitride semiconductor elements 125 and 126.

The nitride semiconductor element 125 of a first example according to the embodiment will now be described.

The substrate 40, the foundation layer 60, the AlGaN foundation layer 63, the stacked body 50, and the functional layer 10 are provided in the nitride semiconductor element 125 as well. The configurations described in regard to the nitride semiconductor element 120 are applicable to the substrate 40, the foundation layer 60, and the functional layer 10. In the stacked body 50 of the nitride semiconductor element 125, four sets (periods) of the set that includes the GaN intermediate layer 51, the first Si-containing layer 52, the high Al composition layer 53, and the low Al composition layer 54 are provided. The number of periods of the stacked intermediate layer is 4.

The nitride semiconductor element 125 according to the embodiment is made as follows.

The substrate 40 includes silicon. The major surface of the substrate 40 is the (111) plane. Cleaning of the substrate 40 is performed using dilute hydrofluoric acid and a mixed chemical liquid of sulfuric acid and hydrogen peroxide. Subsequently, the substrate 40 is introduced to the reactor of a MOCVD apparatus.

The substrate 40 is heated to 1070° C. Tri-methyl aluminum (TMAl) and ammonia ($NH_3$) are supplied for 20 minutes in a reduced-pressure atmosphere. In the reduced-pressure atmosphere, for example, the proportion of hydrogen and nitrogen is 2:1; and the atmosphere is 400 hPa. The flow rate of TMAl is, for example, 50 cc/minute. The flow rate of ammonia ($NH_3$) is, for example, 0.8 L/minute. Thereby, the foundation layer 60 (the AlN buffer layer 62) of AlN is formed. The thickness of the AlN buffer layer 62 is about 200 nm.

The substrate temperature (the temperature of the substrate 40) is set to 1020° C. Trimethylgallium (TMGa), TMAl, and ammonia are supplied for 5 minutes. The flow rate of TMGa is, for example, 10 cc/minute. The flow rate of TMAl is, for example, 50 cc/minute. The flow rate of ammonia is, for example, 2.5 L/minute. Thereby, a first AlGaN foundation layer 63a that has an Al composition ratio of 0.55 is formed. The thickness of the first AlGaN foundation layer 63a is about 100 nm.

TMG and TMA are supplied for 10 minutes. At this time, the flow rate of TMG is modified to, for example, 17 cc/minute. For example, the flow rate of TMA is modified to 30 cc/minute. Thereby, a second AlGaN foundation layer 63b that has an Al composition ratio of 0.3 is formed. The thickness of the second AlGaN foundation layer 63b is about 200 nm.

TMG and TMA are supplied for 11 minutes. At this time, the flow rate of TMG is modified to, for example, 20 cc/minute. For example, the flow rate of TMA is modified to 15 cc/minute. Thereby, a third AlGaN foundation layer 63c that has an Al composition ratio of 0.15 is formed. The thickness of the third AlGaN foundation layer 63c is about 250 nm.

The substrate temperature is set to 1090° C.; and TMG and ammonia are supplied for 15 minutes. The flow rate of TMG is, for example, 56 cc/minute. The flow rate of ammonia is, for example, 40 L/minute. Thereby, the GaN intermediate layer 51 is formed. The thickness of the GaN intermediate layer 51 is about 300 nm.

The substrate temperature is set to 1040° C.; the growth pressure is modified to atmospheric pressure of 1013 hPa; and silane ($SiH_4$) and ammonia are supplied for 4 minutes. The concentration of silane is, for example, 10 ppm. The flow rate of silane is, for example, 350 cc/minute. The flow rate of ammonia is, for example, 20 L/minute. Thereby, the first Si-containing layer 52 is formed. The thickness of the first Si-containing layer 52 is, for example, a thickness corresponding to about 0.5 atomic layers.

The substrate temperature is set to 800° C.; the growth pressure is modified to 400 hPa; and TMA and ammonia are supplied for 3 minutes. The flow rate of TMA is, for example, 17 cc/minute. The flow rate of ammonia is, for example, 10 L/minute. Thereby, a high Al composition layer 53 that is made of AlN is formed. The thickness of the high Al composition layer 53 is about 12 nm.

Then, the substrate temperature is set to 1120° C.; and TMGa, TMAl, and ammonia are supplied for 2.5 minutes. The flow rate of TMGa is, for example, 18 cc/minute. The flow rate of TMAl is, for example, 6 cc/minute. The flow rate of ammonia is, for example, 2.5 L/minute. Thereby, a low Al composition layer 54 that has an Al composition ratio of 0.5 is formed. The thickness of the low Al composition layer 54 is, for example, about 25 nm.

Then, three more periods of the stacked intermediate layer are formed for the stacked intermediate layer recited above that includes, as one period, the GaN intermediate layer 51, the first Si-containing layer 52, the high Al composition layer 53, and the low Al composition layer 54. The number of periods of the stacked intermediate layers in the stacked body of the sample made by the inventor is 4.

The substrate temperature is set to 1090° C.; and an undoped GaN layer 11i that has a thickness of 1 μm is formed on the fourth low Al composition layer 54. For example, the major surface of the nitride semiconductor crystal is the (0001) plane (c-plane).

An n-type GaN layer that has a thickness of 1 μm is formed. Silicon is used as the n-type impurity. The impurity concentration is, for example, $5 \times 10^{18}$ cm$^{-3}$. The n-type GaN layer is used as at least a portion of the functional layer 10.

The substrate 40, the foundation layer 60, the AlGaN foundation layer 63, the stacked body 50, and the functional layer 10 are provided in the nitride semiconductor element 126 of a reference example as well. The configurations described in regard to the nitride semiconductor element 125 are applicable to the substrate 40, the foundation layer 60, the AlGaN foundation layer 63, and the functional layer 10. In the stacked body 50, four sets (periods) of the set that includes the GaN intermediate layer 51, the high Al composition layer 53, and the low Al composition layer 54 are provided. The first Si-containing layer 52 is not provided in the nitride semiconductor element 126. The configuration of the nitride semiconductor element 126 corresponds to the configuration of the nitride semiconductor element 125 in which the first Si-containing layer 52 is omitted.

The horizontal axis of FIG. 4 is the thickness $t_{GaN}$ (nm) when growing the GaN layer 11i formed on the stacked body 50. The vertical axis of FIG. 4 is a curvature Cv (km$^{-1}$=1000 m$^{-1}$) of the substrate 40 in the crystal growth. The curvature Cv is a value that substantially corresponds to the warp of the substrate 40. The curvature Cv of the substrate 40 is a value measured by optical monitoring. The curvature Cv illustrates the transition of the warp of the substrate 40 when performing the crystal growth of the GaN layer 11i. In the drawing, the curvature Cv is such that the warp of the substrate 40 is taken to be 0 when starting the crystal growth of the GaN layer 11i. A positive value of the curvature Cv corresponds to the state of a downward protrusion (warp having a concave configuration). A negative value corresponds to the state of an upward protrusion (warp having a convex configuration). A positive curvature Cv corresponds to the warp of the substrate 40 due to the tensile stress applied to the nitride semiconductor crystal. A negative curvature Cv corresponds to the warp of the substrate 40 due to the compressive stress applied to the nitride semiconductor crystal.

In the nitride semiconductor element 125 according to the embodiment as shown in FIG. 4, the change amount of the warp at the point in time when the GaN layer 11i of 300 nm is formed is about 20 km$^{-1}$. The change amount of the nitride semiconductor element 126 of the reference example is about 7 km$^{-1}$. The change amount of the warp of the nitride semiconductor element 125 is larger than the change amount of the warp of the nitride semiconductor element 126. A large change amount of the warp means a large compressive stress is formed in the crystal. The warp of the substrate at room temperature after the crystal growth ends can be reduced by increasing the compressive stress formed in the GaN layer 11i. Thereby, the cracks can be suppressed.

Thus, the first Si-containing layer 52 is formed between the GaN intermediate layer 51 and the high Al composition layer 53. Thereby, for example, the relaxation of the high Al composition layer 53 is large. Thereby, the compressive stress that is formed in the layer (e.g., the GaN layer 11i) formed on the stacked body 50 can be increased.

For example, the lattice spacing of the high Al composition layer 53 decreases as the relaxation of the high Al composition layer 53 is increased. As a result, the difference between the lattice spacing of the high Al composition layer 53 and the lattice spacing of the low Al composition layer 54 becomes large. The difference between the lattice spacing of the high Al composition layer 53 and the lattice spacing of the GaN layer 11i becomes large. Thereby, the compressive strain increases.

Figure 5:
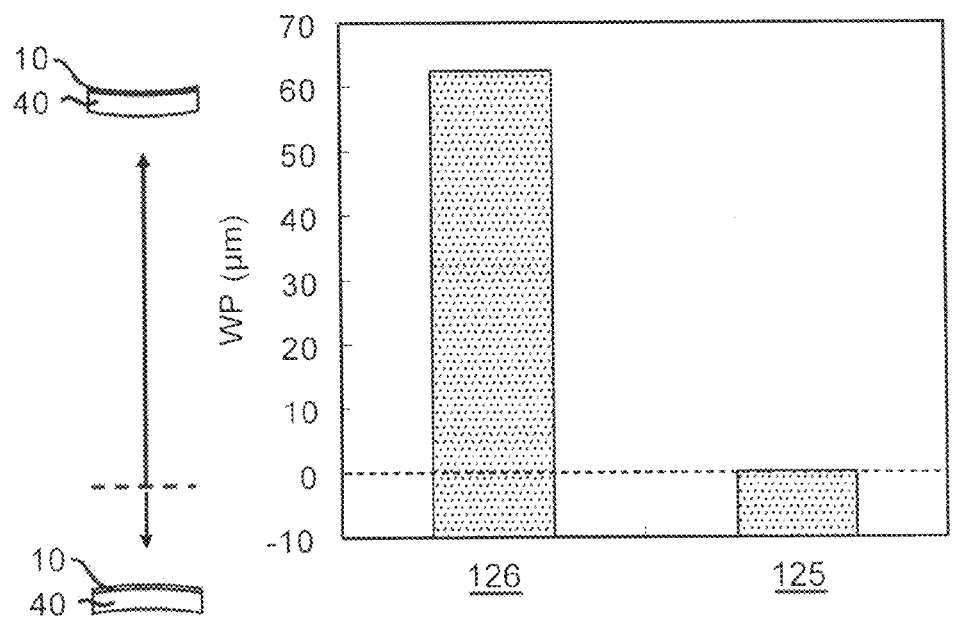
FIG. 5 is a graph of characteristics of the nitride semiconductor elements.

FIG. 5 is a graph of characteristics of the nitride semiconductor elements.

FIG. 5 shows warp WP (μm) of the substrate for the nitride semiconductor elements 125 and 126. The warp WP of the substrate is the warp at room temperature after the crystal growth ends. The warp WP of the substrate is derived by measuring the warp of the substrate 40 (the silicon substrate) using a warp measuring device.

In the nitride semiconductor element 125 according to the embodiment as shown in FIG. 5, the warp WP at room temperature is small and is about 0 (μm). On the other hand, in the nitride semiconductor element 126 of the reference example, the warp WP at room temperature is large and is 63 (μm). Cracks are formed in the nitride semiconductor element 126.

The first Si-containing layer 52 is provided between the GaN intermediate layer 51 and the high Al composition layer 53. Thereby, the warp of the substrate is suppressed.

Figure 6:
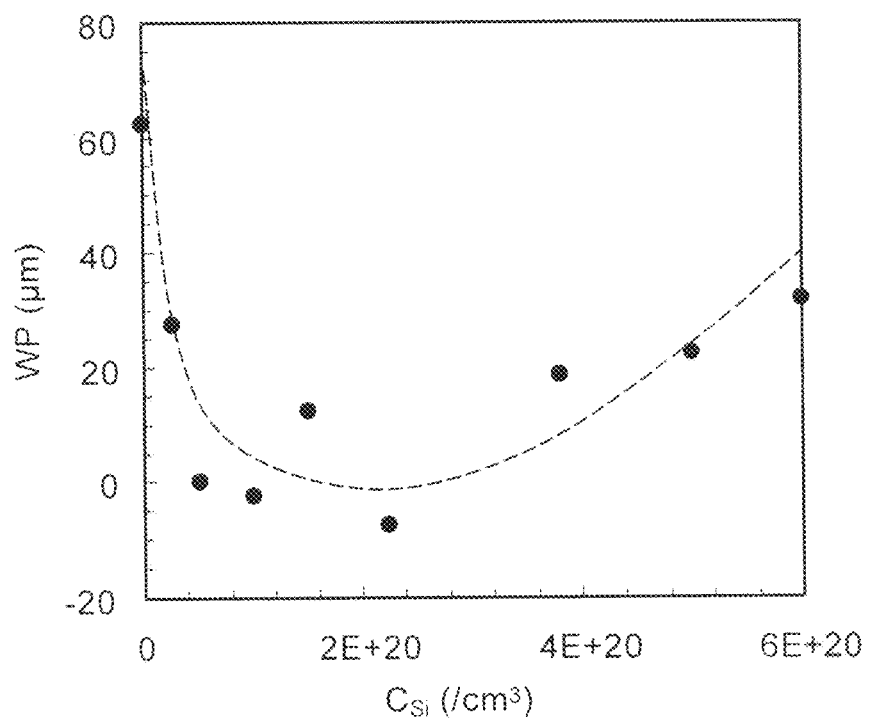
FIG. 6 is a graph of a characteristic of a nitride semiconductor element.

FIG. 6 is a graph of a characteristic of a nitride semiconductor element.

FIG. 6 shows the relationship between the Si concentration $C_{Si}$ (/cm$^3$) of the first Si-containing layer 52 and the warp WP (μm) of the substrate for a nitride semiconductor element that has a configuration similar to that of the nitride semiconductor element 125.

As shown in FIG. 6, when the Si concentration $C_{Si}$ (/cm$^3$) is 2.5×10$^{19}$ (/cm$^3$), the warp WP is small and is about 30 p.m. When the Si concentration $C_{Si}$ (/cm$^3$) is 5×10$^{20}$ (/cm$^3$), the warp WP is small and is about 20 μm. When the Si concentration $C_{Si}$ (/cm$^3$) is 2.0×10$^{20}$ (/cm$^3$), the warp WP is close to 0 μm.

In the embodiment, for example, the Si concentration of the first Si-containing layer 52 is not less than 2.5×10$^{19}$ (/cm$^3$) and not more than 5.0×10$^{20}$ (/cm$^3$). Thereby, the warp of the substrate can be suppressed. In the case where the Si concentration of the first Si-containing layer 52 is less than 2.5×10$^{19}$ (/cm$^3$), the three-dimensional growth of the high Al composition layer 53 does not occur easily; and the high Al composition layer 53 is not relaxed easily. In the case where the Si concentration of the first Si-containing layer 52 is greater than 5.0×10$^{20}$ (/cm$^3$), the coverage of the first Si-containing layer 52 on the GaN intermediate layer 51 is high; and a flat high Al composition layer 53 is not obtained easily. Therefore, the compressive stress of the layer (e.g., the functional layer 10) formed on the high Al composition layer 53 is not formed easily.

For example, there is a nitride semiconductor element 127 of another reference example. In the nitride semiconductor element 127 as well, the substrate 40, the foundation layer 60, the AlGaN foundation layer 63, the stacked body 50, and the functional layer 10 are stacked in this order. Configurations similar to those described in regard to the nitride semiconductor element 125 are applicable to the substrate 40, the foundation layer 60, the AlGaN foundation layer 63, and the functional layer 10. The GaN intermediate layer 51, the high Al composition layer 53, the low Al composition layer 54, and the Si-containing layer are stacked in order in the stacked body 50.

In the nitride semiconductor element 127 of the reference example, the Si-containing layer is not provided between the GaN intermediate layer 51a of the first stacked unit 50a and the high Al composition layer 53a of the first stacked unit 50a. In the nitride semiconductor element 127, for example, the Si-containing layer is provided between the low Al composition layer 54a of the first stacked unit 50a and the GaN intermediate layer 51b of the second stacked unit 50b. The configuration of the nitride semiconductor element 127 corresponds to the configuration of the nitride semiconductor element 125 in which the position of the first Si-containing layer 52 is modified. For example, the thickness of the Si-containing layer of the nitride semiconductor element 127 is 20 nm or more.

In the nitride semiconductor element 127, a Si-containing layer is provided on the low Al composition layer 54a having a small lattice spacing. A GaN intermediate layer having a large lattice spacing is provided on the Si-containing layer. In such a case, compressive stress is not formed easily in the layer on the Si-containing layer.

On the other hand, in the nitride semiconductor element 125 according to the embodiment, the first Si-containing layer 52a is provided on the GaN intermediate layer 51a that has a large lattice spacing. The high Al composition layer 53a that has a small lattice spacing is provided on the first Si-containing layer 52a. In such a case, compressive stress is formed easily in the layer on the Si-containing layer. The thickness of the first Si-containing layer 52a is, for example, 20 nm or less. Thereby, the high Al composition layer 53a that is formed on the first Si-containing layer 52a is grown, for example, three-dimensionally; and the lattice relaxation occurs easily. Therefore, the compressive stress is formed easily in the layer (e.g., the functional layer 10) formed on the high Al composition layer 53a. Thereby, in the nitride semiconductor element 125, the occurrence of warp and cracks of the substrate is suppressed.

Second Embodiment

FIG. 7A to FIG. 7D are schematic views illustrating a nitride semiconductor element according to a second embodiment.

Figures 7A, 7B, 7C, 7D:
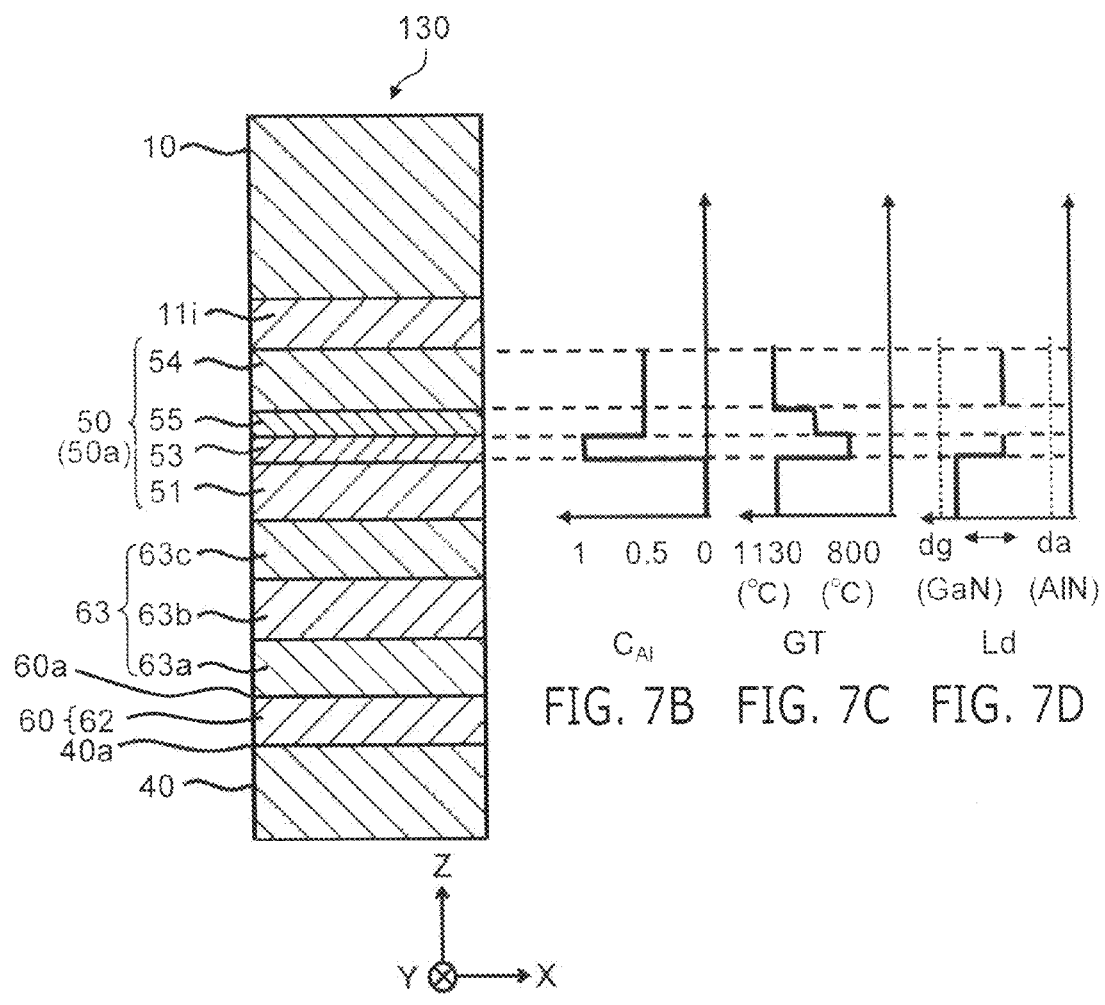
FIG. 7A to FIG. 7D are schematic views illustrating a nitride semiconductor element according to a second embodiment.

FIG. 7A is a schematic cross-sectional view showing the nitride semiconductor element 130 according to the embodiment. FIG. 7B is a graph of the Al composition ratio ($C_{Al}$) of the stacked body. FIG. 7C is a graph of the growth temperature GT (the formation temperature) of the stacked body. FIG. 7D is a graph of the lattice spacing Ld of the a-axis of the stacked body.

As shown in FIG. 7A, the nitride semiconductor element 130 according to the embodiment includes the foundation layer 60, the stacked body 50, the functional layer 10, and the substrate 40. The foundation layer 60 has the major surface 60a. The stacked body 50 is provided between the major surface 60a of the foundation layer 60 and the functional layer 10. The stacked body 50 includes the first stacked unit 50a.

The configuration of the foundation layer 60 and the configuration of the functional layer 10 are similar to those described in regard to the nitride semiconductor element 110, and a description is omitted. In such a case as well, the GaN layer 11i (the undoped GaN layer) may be provided between the stacked body 50 and the functional layer 10.

In the nitride semiconductor element 130, the configuration of the stacked body 50 is different from that of the nitride semiconductor element 110. The stacked body 50 will now be described.

In the nitride semiconductor element 130, the stacked body 50 includes the GaN intermediate layer 51 (the GaN intermediate layer 51a of the first stacked unit 50a), the high Al composition layer 53 (the high Al composition layer 53a of the first stacked unit 50a), a second Si-containing layer 55, and the low Al composition layer 54 (the low Al composition layer 54a of the first stacked unit 50a).

The GaN intermediate layer 51 is provided between the substrate 40 and the functional layer 10. The low Al composition layer 54 is provided between the GaN intermediate layer 51 and the functional layer 10. The high Al composition layer 53 is provided between the GaN intermediate layer 51 and the low Al composition layer 54. The second Si-containing layer 55 is provided between the low Al composition layer 54 and the high Al composition layer 53.

The high Al composition layer 53 (the high Al composition layer 53a of the first stacked unit 50a) includes $Al_{x1}Ga_{1-x1}N$ (0<x1≤1). The high Al composition layer 53 (the high Al composition layer 53a of the first stacked unit 50a) includes, for example, AlN. The low Al composition layer 54 (the low Al composition layer 54a of the first stacked unit 50a) includes $Al_{y1}Ga_{1-y1}N$ (0<y1<1 and y1<x1).

Configurations similar to the configurations described in regard to the nitride semiconductor element 110 are applicable to the GaN intermediate layer 51, the high Al composition layer 53, and the low Al composition layer 54.

The second Si-containing layer 55 contains silicon (Si). The first Si-containing layer 52 contains silicon (Si). For example, the first Si-containing layer 52 includes a compound (e.g., silicon nitride (SiN)) including nitrogen and Si. The first Si-containing layer 52 may include a delta-doped layer of Si. The Si concentration and/or thickness of the second Si-containing layer 55 has fluctuation in the plane (in the X-Y plane) perpendicular to the stacking direction. For example, in the region where the Si concentration and/or the thickness is large, the second Si-containing layer 55 blocks the dislocations occurring on the foundation layer side of the second Si-containing layer 55. The coverage of the second Si-containing layer 55 on the high Al composition layer 53 is high. Thereby, for example, the dislocations are reduced further.

Misfit dislocations occur due to, for example, the relaxation of the high Al composition layer 53. In the example, the second Si-containing layer 55 contacts the high Al composition layer 53. The second Si-containing layer 55 blocks the misfit dislocations. Thereby, the dislocations that propagate into the layer (e.g., the functional layer 10) formed on the second Si-containing layer 55 can be reduced.

The thickness of the second Si-containing layer 55 is, for example, a thickness corresponding to 1 atomic layer. For example, it is favorable to be a thickness corresponding to not less than 0.2 atomic layers and not more than 2.5 atomic layers. In the case where the thickness of the second Si-containing layer 55 is thinner than a thickness corresponding to 0.2 atomic layers, the dislocations are not shielded sufficiently. The dislocations that propagate into the functional layer 10 increase. On the other hand, in the case where the thickness of the second Si-containing layer 55 is thicker than a thickness corresponding to 2.5 atomic layers, the low Al composition layer 54 does not have coherent growth; and there are cases where fluctuation of the crystal axis occurs and the crystal quality decreases.

The second Si-containing layer 55 may not be a uniform layer and may be a layer having a discontinuous island configuration, etc. The second Si-containing layer 55 may be a layer in which openings are provided.

The thickness of the second Si-containing layer 55 is obtained by direct observation using, for example, a transmission electron microscope (TEM) image or a scanning electron microscope (SEM) image. When performing the observation by SEM, a cross section of the nitride semiconductor layer or the substrate when cut by a cleavage plane is used. The thickness of the second Si-containing layer 55 is obtained from secondary ion mass spectrometry (SIMS). When the Si concentration inside the layer is about $2\times10^{20}$/cubic centimeter (/cm$^3$) in secondary ion mass spectrometry, the thickness of the second Si-containing layer 55 is a thickness corresponding to 1 atomic layer. The Si concentration corresponds to a Si surface density of about $1\times10^{15}$/square centimeter (/cm$^2$) when converting to surface density.

The horizontal axis of FIG. 7C is the growth temperature GT. As shown in FIG. 7C, the growth temperature GT of the second Si-containing layer 55 is not more than the growth temperature GT of the GaN intermediate layer 51. By setting the growth temperature GT of the second Si-containing layer 55 to be not more than the growth temperature GT of the GaN intermediate layer 51, the decrease of the flatness of the GaN intermediate layer 51 due to etching when forming the second Si-containing layer 55 can be suppressed. It is favorable for the growth temperature GT of the second Si-containing layer 55 to be, for example, not less than 900° C. and not more than 1150° C., e.g., about 1100° C.

FIG. 8A to FIG. 8D are schematic views illustrating another nitride semiconductor element according to the second embodiment.

Figures 8A, 8B, 8C, 8D:
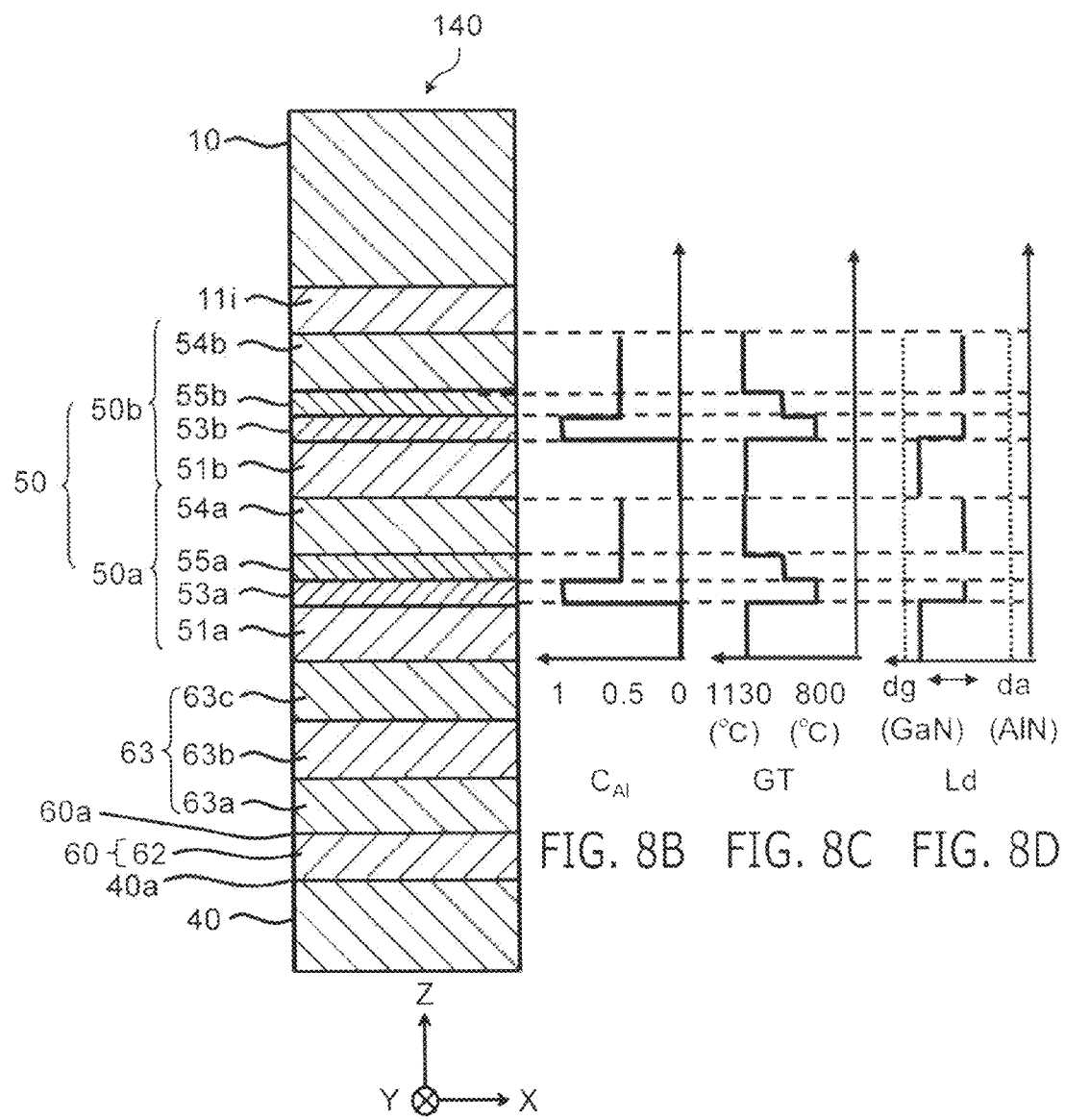
FIG. 8A to FIG. 8D are schematic views illustrating another nitride semiconductor element according to the second embodiment.

FIG. 8A is a schematic cross-sectional view showing the nitride semiconductor element 140 according to the embodiment. FIG. 8B to FIG. 8D are graphs of the Al composition ratio ($C_{Al}$), the growth temperature GT, and the lattice spacing Ld of the a-axis of the stacked body, respectively.

As shown in FIG. 8A, the nitride semiconductor element 140 includes the foundation layer 60, the AlGaN foundation layer 63, the stacked body 50, and the functional layer 10. The configurations described in regard to the nitride semiconductor element 120 are applicable to the foundation layer 60, the AlGaN foundation layer 63, and the functional layer 10. The stacked body 50 includes the first stacked unit 50a and the second stacked unit 50b. The second stacked unit 50b is provided between the first stacked unit 50a and the functional layer 10. The configuration of the first stacked unit 50a and the configuration of the second stacked unit 50b are similar to the configuration of the first stacked unit 50a of the nitride semiconductor element 130. In other words, the nitride semiconductor element 140 includes the stacked body 50 of the nitride semiconductor element 130 multiply formed repeatedly.

In the nitride semiconductor element 140, two sets (periods) of the set that includes the GaN intermediate layer 51, the high Al composition layer 53, the second Si-containing layer 55, and the low Al composition layer 54 are provided. The embodiment is not limited thereto; and the number of sets (periods) may be three or more.

Thus, the stacked body 50 may have a structure in which the GaN intermediate layer 51, the high Al composition layer 53, the second Si-containing layer 55, and the low Al composition layer 54 are multiply stacked periodically in this order. Thereby, the dislocations are reduced further by the second Si-containing layer 55. The dislocation density of the functional layer 10 is reduced further.

Figure 9:
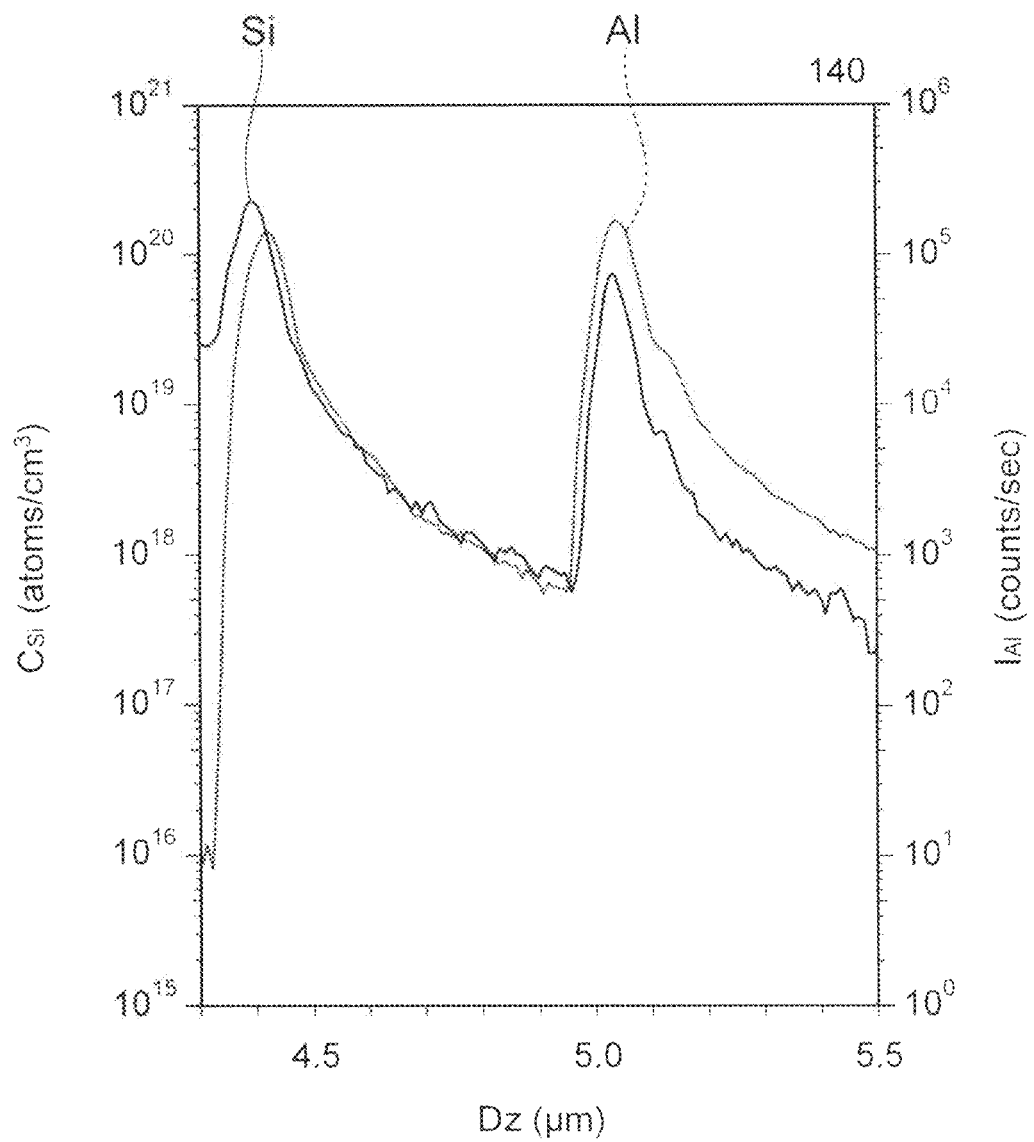
FIG. 9 is a graph of the nitride semiconductor according to the second embodiment.

FIG. 9 is a graph of the nitride semiconductor according to the second embodiment.

FIG. 9 shows the measurement results of the nitride semiconductor element 140 obtained by SIMS. The left vertical axis of FIG. 9 is the concentration $C_{Si}$ of Si. The right vertical axis of FIG. 9 is the secondary ion intensity $I_{Al}$ of Al. The horizontal axis of FIG. 9 is the depth Dz along the Z-axis direction of the sample. FIG. 9 shows an enlarged portion corresponding to the stacked body 50 of the nitride semiconductor element 140.

For example, the peaks of the concentration $C_{Si}$ correspond to the second Si-containing layer 55 (a second Si-containing layer 55a of the first stacked unit 50a or a second Si-containing layer 55b of the second stacked unit 50b). The peaks of the secondary ion intensity $I_{Al}$ correspond to the high Al composition layer 53 (the high Al composition layer 53a of the first stacked unit 50a or the high Al composition layer 53b of the second stacked unit 50b). As shown in FIG. 9, the peak positions of the concentration $C_{Si}$ and the peak positions of the secondary ion intensity $I_{Al}$ are different from each other. This indicates the existence of the second Si-containing layer 55.

In the example, the concentration $C_{Si}$ is about $1 \times 10^{20}$ to $2 \times 10^{20}/cm^3$. In such a case, the thickness of the second Si-containing layer 55 is a thickness corresponding to 1 atomic layer. The concentration $C_{Si}$ is about $5.0 \times 10^{14}/cm^2$ when converting to surface density. For example, the Si concentration $C_{Si}$ of the second Si-containing layer 55 is not less than $5.0 \times 10^{19}/cm^3$ and not more than $4.0 \times 10^{20}/cm^3$. For example, the thickness of the second Si-containing layer 55 is not less than 0.1 nm and less than 20 nm. It is favorable for the thickness of the second Si-containing layer 55 to be not less than 0.2 nm and not more than 4 nm.

The nitride semiconductor element 140 of the second example according to the embodiment will now be described.

The manufacturing methods described in regard to the nitride semiconductor elements 110 and 120 may be modified appropriately and are applicable to the method for manufacturing the nitride semiconductor element 140. The formation of the stacked body 50 will now be described.

After forming an AlGaN foundation layer 63 similar to that of the nitride semiconductor element 110, the substrate temperature is set to 1090° C.; and TMG and ammonia are supplied for 20 minutes. The flow rate of TMG is, for example, 56 cc/minute. The flow rate of ammonia is, for example, 40 L/minute. Thereby, the GaN intermediate layer 51 is formed. The thickness of the GaN intermediate layer 51 is about 400 nm.

The substrate temperature is set to 800° C.; and TMA and ammonia are supplied for 3 minutes. The flow rate of TMA is, for example, 17 cc/minute. The flow rate of ammonia is, for example, 10 L/minute. Thereby, a high Al composition layer 53 that includes AlN (is made of AlN) is formed. The thickness of the high Al composition layer 53 is about 12 nm.

The substrate temperature is set to 1040° C.; the growth pressure is modified to atmospheric pressure of 1013 hPa; and silane and ammonia are supplied for 8 minutes. For example, the concentration of silane is 10 ppm; and the flow rate of silane is 350 cc/minute. For example, the flow rate of ammonia is 20 L/minute. Thereby, the second Si-containing layer 55 is formed. The thickness of the second Si-containing layer 55 is a thickness corresponding to about 1 atomic layer.

The substrate temperature is set to 1120° C.; the growth pressure is modified to 400 hPa; and TMGa, TMAl, and ammonia are supplied. The flow rate of TMGa is, for example, 18 cc/minute. The flow rate of TMAl is, for example, 6 cc/minute. The flow rate of ammonia is 2.5 L/minute. Thereby, a low Al composition layer 54 that has an Al composition ratio of 0.5 is formed. The thickness of the low Al composition layer 54 is about 25 nm.

Then, three more periods of the stacked body are formed for the stacked body recited above that includes, as one period, the GaN intermediate layer 51, the high Al composition layer 53, the second Si-containing layer 55, and the low Al composition layer 54. That is, the number of periods of the stacked intermediate layers in the stacked body of the sample made by the inventor is 4.

Continuing, an undoped GaN layer 11i having a thickness of 1 μm was formed at 1090° C. on the fourth low Al composition layer 54. Subsequently, an n-type GaN layer having a thickness of 1 μm was formed. Silicon was used as the n-type impurity; and the impurity concentration was set to be $5 \times 10^{18}$ cm$^{-3}$. The n-type GaN layer is used as at least a portion of the functional layer 10.

Figure 10:
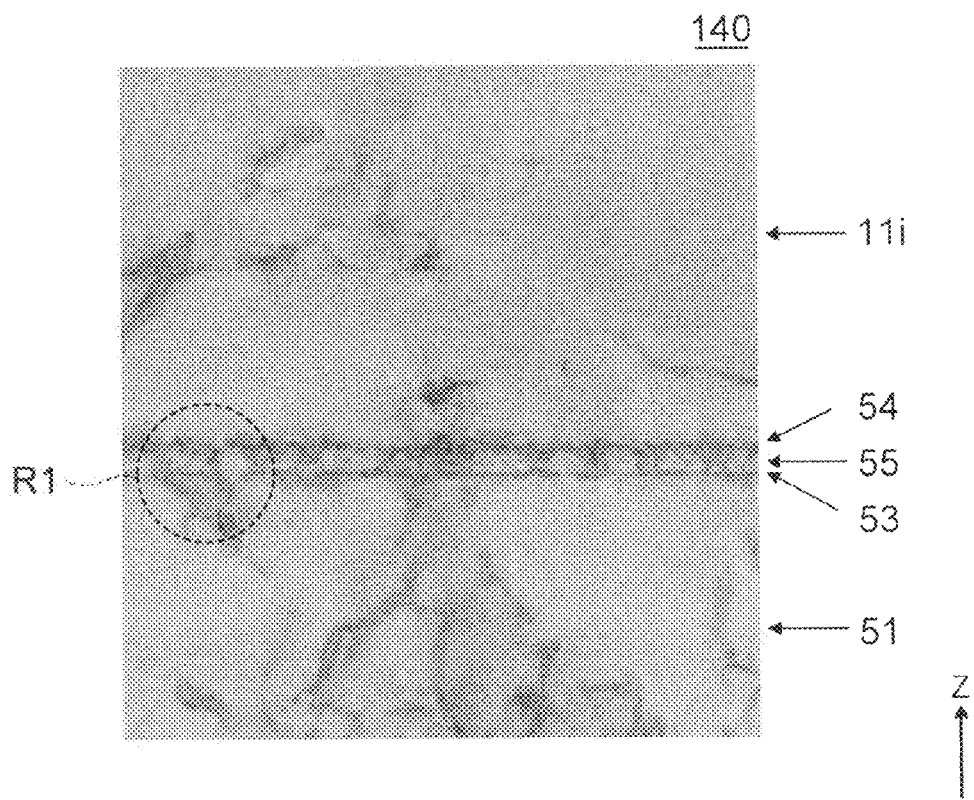
FIG. 10 is a schematic view illustrating the nitride semiconductor element according to the second embodiment.

FIG. 10 is a schematic view illustrating the nitride semiconductor element according to the second embodiment.

FIG. 10 is a TEM image showing an enlarged portion corresponding to the stacked body 50 of the nitride semiconductor element 140.

As shown in FIG. 10, the high Al composition layer 53, the second Si-containing layer 55, the low Al composition layer 54, and the GaN layer 11i are stacked sequentially on the GaN intermediate layer 51. The black line (having a high concentration) in the figure corresponds to the second Si-containing layer 55. For example, dislocations occur in the GaN intermediate layer 51 in a region R1 shown in FIG. 10. The propagation of the dislocations into the low Al composition layer 54 is blocked by the second Si-containing layer 55.

Thus, by forming the second Si-containing layer 55 between the high Al composition layer 53 and the low Al composition layer 54, the dislocations in the layers higher than the second Si-containing layer 55 can be reduced.

Characteristics of the nitride semiconductor element of the embodiment will now be described with reference to the drawings.

Figure 11:
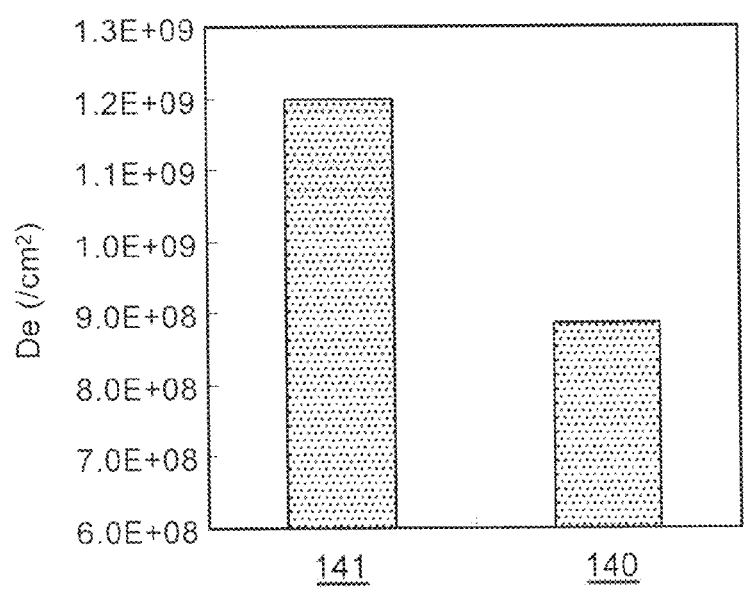
FIG. 11 is a graph of characteristics of nitride semiconductor elements.

FIG. 11 is a graph of characteristics of nitride semiconductor elements.

FIG. 11 shows an edge dislocation density De/square centimeter ($/cm^2$) for the nitride semiconductor elements 140 and 141.

In the nitride semiconductor element 141 of a second reference example as well, the substrate 40, the foundation layer 60, the AlGaN foundation layer 63, the stacked body 50, and the functional layer 10 are provided. The GaN intermediate layer 51, the high Al composition layer 53, and the low Al composition layer 54 are provided in the stacked body 50. The configurations described in regard to the nitride semiconductor element 140 are applicable to the substrate 40, the foundation layer 60, the AlGaN foundation layer 63, the functional layer 10, the GaN intermediate layer 51, the high Al composition layer 53, and the low Al composition layer 54. The second Si-containing layer 55 is not provided in the nitride semiconductor element 141. The configuration of the nitride semiconductor element 141 corresponds to the configuration of the nitride semiconductor element 140 in which the second Si-containing layer 55 is omitted. In the nitride semiconductor element 141 of the second reference example, the low Al composition layer 54 is formed in contact with the high Al composition layer 53.

An edge dislocation density De is derived from the rocking curve widths at half maximum of the (0002) plane, the (0004) plane, the (10-11) plane, and the (20-22) plane of X-ray diffraction measurements.

The edge dislocation density De of the nitride semiconductor element 140 of the second example is $8.9 \times 10^8$ ($/cm^2$) and is lower than the edge dislocation density De of the nitride semiconductor element 141 of the second reference example.

The edge dislocation density De of the nitride semiconductor element 141 of the second reference example is $1.2 \times 10^9$ ($/cm^2$) and is higher than the edge dislocation density De of the nitride semiconductor element 140 of the second example. This is because, for example, the dislocations are not shielded by the second Si-containing layer 55.

Thus, the dislocations of the functional layer 10 can be reduced by forming the second Si-containing layer 55 between the high Al composition layer 53 and the low Al composition layer 54.

Figure 12:
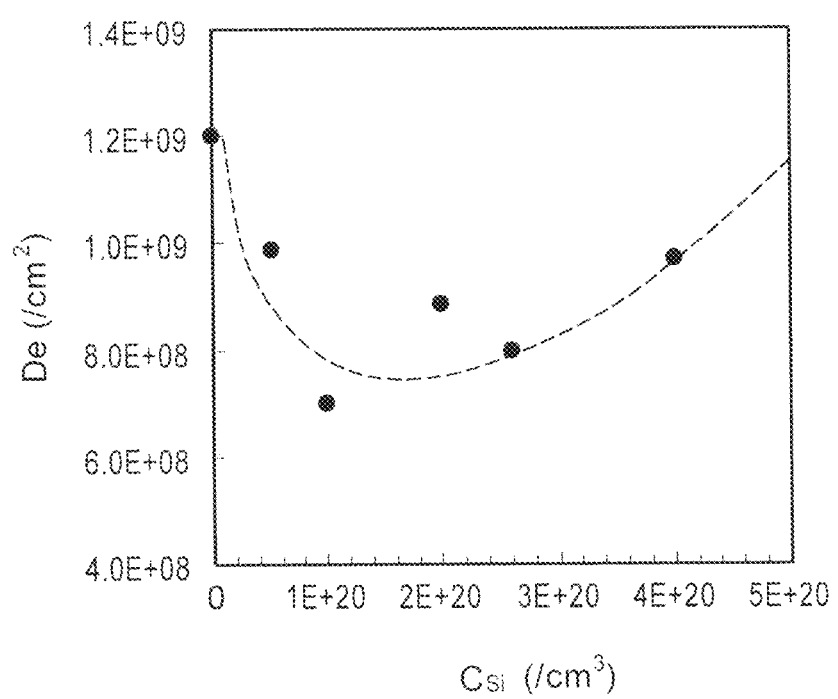
FIG. 12 is a graph of a characteristic of a nitride semiconductor element.

FIG. 12 is a graph of a characteristic of a nitride semiconductor element.

FIG. 12 shows the relationship between the dislocation density De ($/cm^2$) and the Si concentration $C_{Si}$ ($/cm^3$) of the second Si-containing layer 55 in a nitride semiconductor element having a configuration similar to that of the nitride semiconductor element 140.

As shown in FIG. 12, when the Si concentration $C_{Si}$ is $5.0 \times 10^{19}$ ($/cm^3$), the dislocation density De is about $9.0 \times 10^8$ ($/cm^2$). When the Si concentration $C_{Si}$ is $4.0 \times 10^{20}$ ($/cm^3$), the dislocation density De is about $9.4 \times 10^8$ ($/cm^2$). When the Si concentration $C_{Si}$ is $2.0 \times 10^{20}$ ($/cm^3$), the dislocation density De is about $7.5 \times 10^8$ ($/cm^2$).

In the embodiment, for example, the Si concentration of the second Si-containing layer 55 is set to be not less than $5.0 \times 10^{19}$ ($/cm^3$) and not more than $4.0 \times 10^{20}$ ($/cm^3$). Thereby, the dislocations of the functional layer 10 can be suppressed. In the case where the Si concentration of the second Si-containing layer 55 is less than $5.0 \times 10^{19}$ ($/cm^3$), the coverage of the second Si-containing layer 55 on the high Al composition layer 53 is low; and the shielding effect of the misfit dislocations is not obtained easily. Also, the three-dimensional growth of the low Al composition layer 54 does not occur easily; and bending of the dislocations at the low Al composition layer 54 does not occur easily. In the case where the Si concentration of the second Si-containing layer 55 is greater than $4.0 \times 10^{20}$ ($/cm^3$), a flat low Al composition layer 54 is not obtained easily; and the crystal quality of the functional layer 10 formed on the low Al composition layer 54 decreases.

Third Embodiment

FIG. 13A to FIG. 13D are schematic views illustrating a nitride semiconductor element according to a third embodiment.

FIG. 13A is a schematic cross-sectional view showing the nitride semiconductor element 150 according to the embodiment. FIG. 13B is a graph of the Al composition ratio ($C_{Al}$) of the stacked body. FIG. 13C is a graph of the growth temperature GT (the formation temperature) of the stacked body. FIG. 13D is a graph of the lattice spacing Ld of the a-axis of the stacked body.

As shown in FIG. 13A, the nitride semiconductor element 150 according to the embodiment includes the foundation layer 60, the stacked body 50, and the functional layer 10. The foundation layer 60 has the major surface 60a. The stacked body 50 is provided between the major surface 60a of the foundation layer 60 and the functional layer 10. The stacked body 50 includes the first stacked unit 50a.

In the nitride semiconductor element 150, the configuration of the stacked body 50 is different from those of the nitride semiconductor element 110 and the nitride semiconductor element 130. The stacked body 50 will now be described.

In the nitride semiconductor element 150, the stacked body 50 includes the GaN intermediate layer 51 (the GaN intermediate layer 51a of the first stacked unit 50a), the first Si-containing layer 52, the high Al composition layer 53 (the first high Al composition layer 53a), the second Si-containing layer 55, and the low Al composition layer 54 (the low Al composition layer 54a of the first stacked unit 50a).

The GaN intermediate layer 51 is provided between the high Al composition layer 53 and the foundation layer 60. The first Si-containing layer 52 is provided between the high Al composition layer 53 and the GaN intermediate layer 51. The high Al composition layer 53 is provided between the second Si-containing layer 55 and the GaN intermediate layer 51. The low Al composition layer 54 is provided between the functional layer 10 and the second Si-containing layer 55. The second Si-containing layer 55 is provided between the low Al composition layer 54 and the high Al composition layer 53.

In other words, the low Al composition layer 54 is provided on the second Si-containing layer 55; the high Al composition layer 53 is provided on the first Si-containing layer 52; and the first Si-containing layer 52 is provided on the GaN intermediate layer 51.

The high Al composition layer 53 (the high Al composition layer 53a of the first stacked unit 50a) includes $Al_{x1}Ga_{1-x1}N$ ($0<x1\leq1$). The high Al composition layer 53 (the first high Al composition layer 53a) includes, for example, AlN. The low Al composition layer 54 (the low Al composition layer 54a of the first stacked unit 50a) includes $Al_{y1}Ga_{1-y1}N$ ($0<y1<1$ and $y1<x1$).

Configurations similar to those described in regard to the nitride semiconductor element 110 and the nitride semiconductor element 130 are applicable to the GaN intermediate layer 51, the first Si-containing layer 52, the high Al composition layer 53, the second Si-containing layer 55, and the low Al composition layer 54. Both dislocations and cracks can be reduced by such a configuration.

FIG. 14A to FIG. 14D are schematic views illustrating another nitride semiconductor element according to the third embodiment.

Figures 14A, 14B, 14C, 14D:
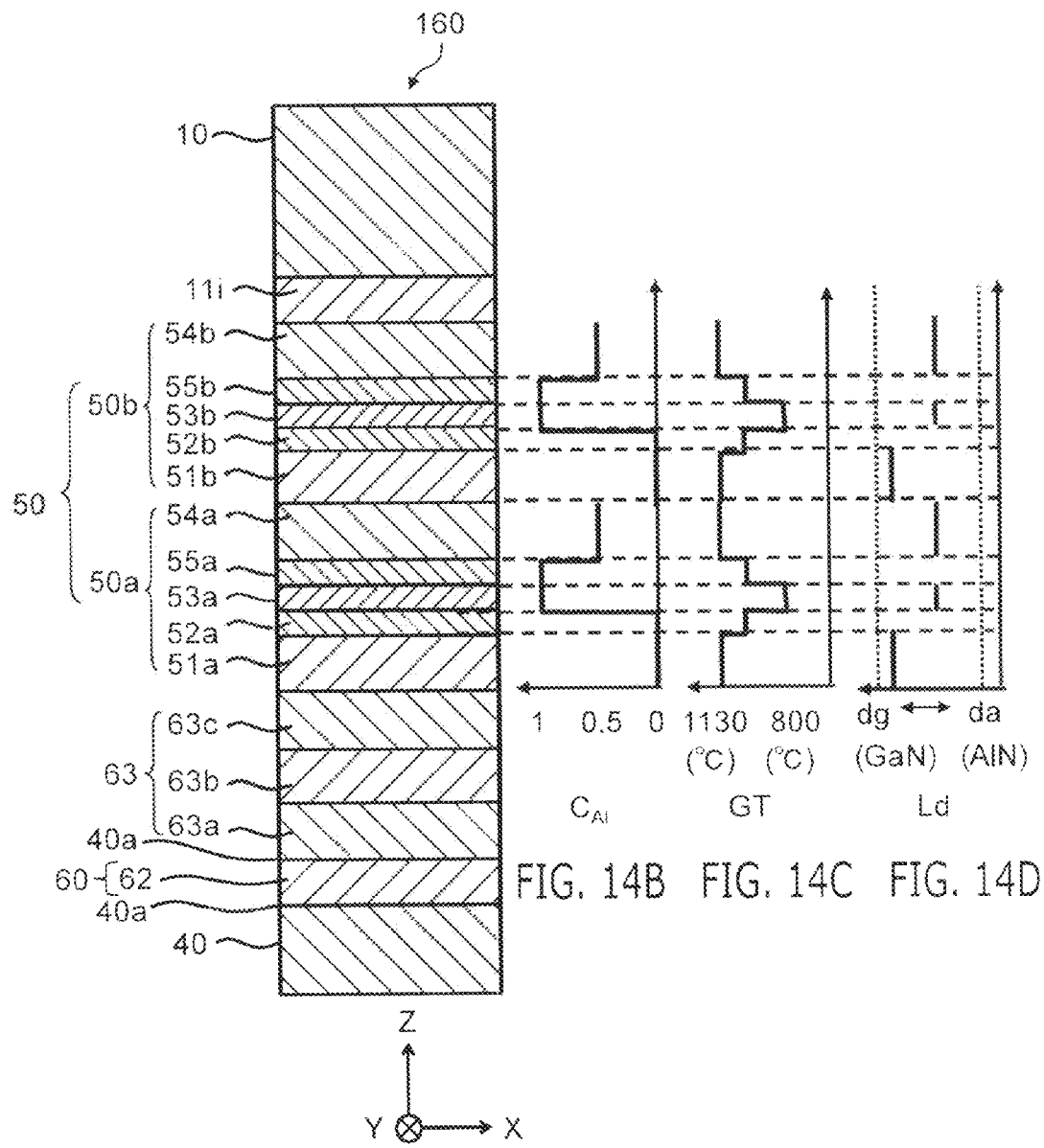
FIG. 14A to FIG. 14D are schematic views illustrating another nitride semiconductor element according to the third embodiment.

FIG. 14A is a schematic cross-sectional view showing the nitride semiconductor element 160 according to the embodiment. FIG. 14B is a graph of the Al composition ratio ($C_{Al}$) of the stacked body. FIG. 14C is a graph of the growth temperature GT (the formation temperature) of the stacked body. FIG. 14D is a graph of the lattice spacing Ld of the a-axis of the stacked body.

As shown in FIG. 14A, the nitride semiconductor element 160 includes the foundation layer 60, the AlGaN foundation layer 63, the stacked body 50, and the functional layer 10. Configurations similar to the configurations described in regard to the nitride semiconductor element 150 are applicable to the foundation layer 60, the AlGaN foundation layer 63, and the functional layer 10. The stacked body 50 includes the first stacked unit 50a and the second stacked unit 50b. The second stacked unit 50b is provided between the first stacked unit 50a and the functional layer 10. The configuration of the first stacked unit 50a and the configuration of the second stacked unit 50b are similar to the configuration of the first stacked unit 50a of the nitride semiconductor element 150. In other words, the nitride semiconductor element 160 includes the stacked body 50 of the nitride semiconductor element 150 multiply formed repeatedly. The embodiment is not limited thereto; and the number of repetitions may be three or more.

Thus, the stacked body 50 can have a structure in which the GaN intermediate layer, the first Si-containing layer, the high Al composition layer, the second Si-containing layer, and the low Al composition layer are multiply stacked periodically in this order. Thereby, the dislocations and the cracks are reduced further.

A nitride semiconductor element 161 having four periods of the stacked intermediate layer was made using the manufacturing method described in regard to the nitride semiconductor element 125 and the nitride semiconductor element 140 for the GaN intermediate layer 51, the first Si-containing layer 52, the high Al composition layer 53, the second Si-containing layer 55, and the low Al composition layer 54. The edge dislocation density De of the nitride semiconductor element 161 that was made was small and was $8.5\times10^8$ (/cm$^2$). Also, the warp WP at room temperature was small and was about 5 (gin). Therefore, the dislocations and the cracks are reduced by the stacked body 50 having the structure in which the GaN intermediate layer, the first Si-containing layer, the high Al composition layer, the second Si-containing layer, and the low Al composition layer are stacked in this order.

Fourth Embodiment

The fourth embodiment relates to a nitride semiconductor wafer. The nitride semiconductor wafer 200 according to the embodiment includes the substrate 40, the functional layer 10, the stacked body 50, the foundation layer 60, the AlGaN foundation layer 63, and the GaN layer 11i. The stacked body includes the GaN intermediate layer 51, the first Si-containing layer 52, the high Al composition layer 53, the second Si-containing layer 55, and the low Al composition layer 54. The configurations described in regard to the nitride semiconductor element 150 are applicable to these layers.

The stacked body 50 is provided between the functional layer 10 and the substrate 40. The low Al composition layer 54 is provided between the GaN intermediate layer 51 and the functional layer 10. The high Al composition layer 53 is provided between the GaN intermediate layer 51 and the low Al composition layer 54. The first Si-containing layer 52 is provided between the GaN intermediate layer 51 and the high Al composition layer 53. The second Si-containing layer 55 is provided between the high Al composition layer 53 and the low Al composition layer 54. Both the dislocations and the cracks can be reduced by using such a configuration.

According to the embodiments, a nitride semiconductor element and a nitride semiconductor wafer for which the warp of the substrate is suppressed can be provided.

In the specification, "nitride semiconductor" includes all compositions of semiconductors of the chemical formula $B_xIn_yAl_zGa_{1-x-y-z}N$ ($0\leq x<1$, $0\leq y<1$, $0\leq z<1$, and $x+y+z\leq1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiments of the invention are not limited to these specific examples. For example, one skilled in the art may similarly practice the invention by appropriately selecting specific configurations of components such as the functional layer, the stacked body, the first Si-containing layer, the second Si-containing layer, the GaN intermediate layer, the low Al composition layer, the high Al composition layer, the substrate, the foundation layer, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all nitride semiconductor elements and nitride semiconductor wafers practicable by an appropriate design modification by one skilled in the art based on the nitride semiconductor elements and nitride semiconductor wafers described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor element, comprising:
a functional layer; and
a stacked body comprising:
 a GaN intermediate layer;
 a low Al composition layer comprising a nitride semiconductor having a first Al composition ratio, the low Al composition layer being provided between the GaN intermediate layer and the functional layer;
 a high Al composition layer comprising a nitride semiconductor having a second Al composition ratio, the high Al composition layer being provided between the GaN intermediate layer and the low Al composition layer, the second Al composition ratio being higher than the first Al composition ratio; and
 a first Si-comprising layer provided between the GaN intermediate layer and the high Al composition layer, wherein the first Si-comprising layer comprises SiN.

2. The element of claim 1, wherein a Si concentration of the first Si-comprising layer is not less than $2.5 \times 10^{19}$/cubic centimeter and not more than $5.0 \times 10^{20}$/cubic centimeter.

3. The element of claim 1, wherein a thickness of the first Si-comprising layer is not less than 0.1 nanometers and less than 20 nanometers.

4. The element of claim 1, wherein the first Si-comprising layer comprises a delta-doped layer of silicon.

5. The element of claim 1, wherein the stacked body further comprises a second Si-comprising layer provided between the low Al composition layer and the high Al composition layer, wherein the second Si-comprising layer comprises SiN.

6. The element of claim 5, wherein a Si concentration of the second Si-comprising layer is not less than $5.0 \times 10^{19}$/cubic centimeter and not more than $4.0 \times 10^{20}$/cubic centimeter.

7. The element of claim 5, wherein a thickness of the second Si-comprising layer is not less than 0.1 nanometers and less than 20 nanometers.

8. The element of claim 5, wherein the second Si-comprising layer includes a delta-doped layer of silicon.

9. The element of claim 1, wherein the high Al composition layer comprises at least one selected from $Al_{x1}Ga_{1-x1}N$ ($0<x1\leq1$) and aluminum nitride.

10. The element of claim 9, wherein the low Al composition layer comprises $Al_{y1}Ga_{1-y1}N$ ($0<y1<1$ and $y1<x1$).

11. The element of claim 1, further comprising:
a substrate; and
a foundation layer,
wherein the stacked body is provided between the substrate and the functional layer, and
wherein the foundation layer is provided between the substrate and the stacked body.

12. The element of claim 11, wherein the substrate comprises silicon.

13. The element of claim 11, wherein the foundation layer comprises aluminum nitride.

14. A nitride semiconductor element, comprising a functional layer formed on a stacked body, wherein the stacked body comprises:
 a GaN intermediate layer;
 a low Al composition layer comprising a nitride semiconductor having a first Al composition ratio, the low Al composition layer being provided between the GaN intermediate layer and the functional layer;
 a high Al composition layer comprising a nitride semiconductor having a second Al composition ratio, the high Al composition layer being provided between the GaN intermediate layer and the low Al composition layer, the second Al composition ratio being higher than the first Al composition ratio; and
 a first Si-comprising layer provided between the GaN intermediate layer and the high Al composition layer, wherein the first Si-comprising layer comprises SiN.

15. The element of claim 14, wherein at least a portion of the stacked body is removed after the functional layer is formed on the stacked body.

16. A nitride semiconductor element, comprising:
a functional layer; and
a stacked body comprising:
 a GaN intermediate layer;
 a low Al composition layer comprising a nitride semiconductor having a first Al composition ratio, the low Al composition layer being provided between the GaN intermediate layer and the functional layer;
 a high Al composition layer comprising a nitride semiconductor having a second Al composition ratio, the high Al composition layer being provided between the GaN intermediate layer and the low Al composition layer, the second Al composition ratio being higher than the first Al composition ratio; and
 a Si-comprising layer provided between the low Al composition layer and the high Al composition layer, wherein the second Si-comprising layer comprises SiN.

17. A nitride semiconductor wafer, comprising:
a substrate;
a functional layer; and
a stacked body provided between the substrate and the functional layer,
wherein the stacked body comprises:
 a GaN intermediate layer;
 a low Al composition layer comprising a nitride semiconductor having a first Al composition ratio, the low Al composition layer being provided between the GaN intermediate layer and the functional layer;
 a high Al composition layer comprising a nitride semiconductor having a second Al composition ratio, the high Al composition layer being provided between the GaN intermediate layer and the low Al composition layer, the second Al composition ratio being higher than the first Al composition ratio; and
 a first Si-comprising layer provided between the GaN intermediate layer and the high Al composition layer, wherein the first Si-comprising layer comprises SiN.

18. The wafer of claim 17, wherein a Si concentration of the first Si-comprising layer is not less than $2.5 \times 10^{19}$/cubic centimeter and not more than $5.0 \times 10^{20}$/cubic centimeter, and wherein a thickness of the first Si-comprising layer is not less than 0.1 nanometers and less than 20 nanometers.

* * * * *